(12) United States Patent
Yoshida et al.

(10) Patent No.: US 6,822,982 B2
(45) Date of Patent: Nov. 23, 2004

(54) DEVICE AND METHOD FOR PROVIDING A TUNABLE SEMICONDUCTOR LASER

(75) Inventors: Junji Yoshida, Tokyo (JP); Naoki Tsukiji, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/214,177

(22) Filed: Aug. 8, 2002

(65) Prior Publication Data

US 2003/0063647 A1 Apr. 3, 2003

Related U.S. Application Data

(60) Provisional application No. 60/364,034, filed on Mar. 15, 2002.

(30) Foreign Application Priority Data

Sep. 28, 2001 (JP) .......................... 2001-303874

(51) Int. Cl.[7] ................................................ H01S 3/10
(52) U.S. Cl. .............................. 372/20; 372/19; 372/32; 372/87; 372/96; 372/102; 372/3
(58) Field of Search ............................ 372/20, 32, 102, 372/19, 87, 96, 3, 45

(56) References Cited

U.S. PATENT DOCUMENTS

| | | | | |
|---|---|---|---|---|
| 4,462,103 A | * | 7/1984 | Salour et al. | 372/35 |
| 5,499,261 A | * | 3/1996 | Welch et al. | 372/50 |
| 5,642,371 A | * | 6/1997 | Tohyama et al. | 372/45 |
| 6,384,963 B2 | | 5/2002 | Ackerman et al. | |
| 6,526,087 B1 | * | 2/2003 | Okuda | 372/96 |
| 6,643,308 B2 | * | 11/2003 | Tsukiji et al. | 372/46 |
| 2003/0133482 A1 | * | 7/2003 | Yoshida et al. | 372/43 |

* cited by examiner

*Primary Examiner*—Leon Scott, Jr.
(74) *Attorney, Agent, or Firm*—Oblon, Spivak, McClelland, Maier & Neustadt, P.C.

(57) ABSTRACT

A semiconductor laser device including a light reflecting facet positioned on a first side of the semiconductor device, a light emitting facet positioned on a second side of the semiconductor device thereby forming a resonator between the light reflecting facet and the light emitting facet, and an active layer configured to radiate light in the presence of an injection current, the active layer positioned within the resonator. A wavelength selection structure is positioned within the resonator and configured to select a spectrum of the light including multiple longitudinal modes, the spectrum being output from the light emitting facet. Also, an electrode positioned along the resonator and configured to provide the injection current, and a tuning current that adjusts a center wavelength of the spectrum selected by the wavelength selection structure.

34 Claims, 20 Drawing Sheets

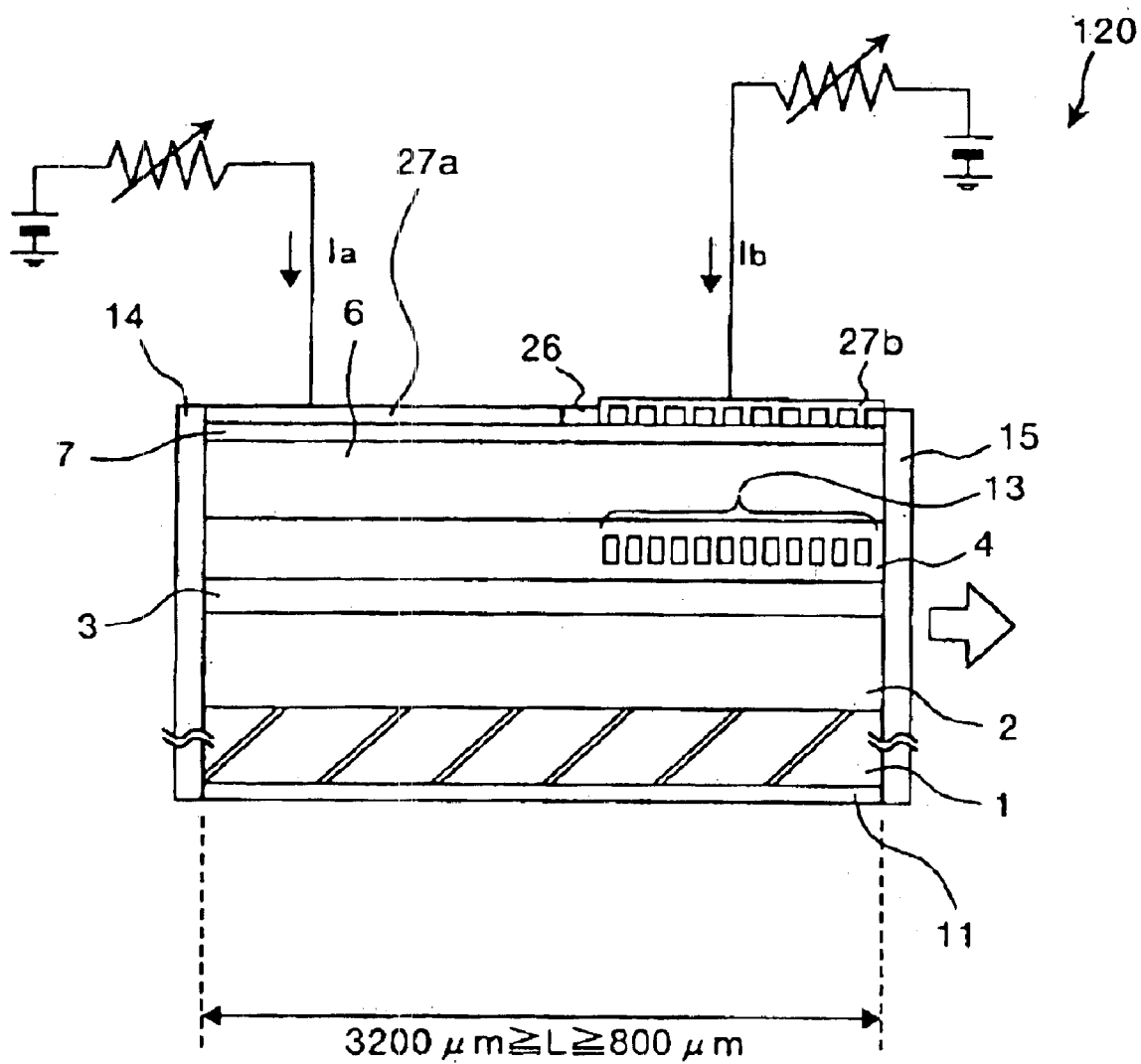

FIG.19
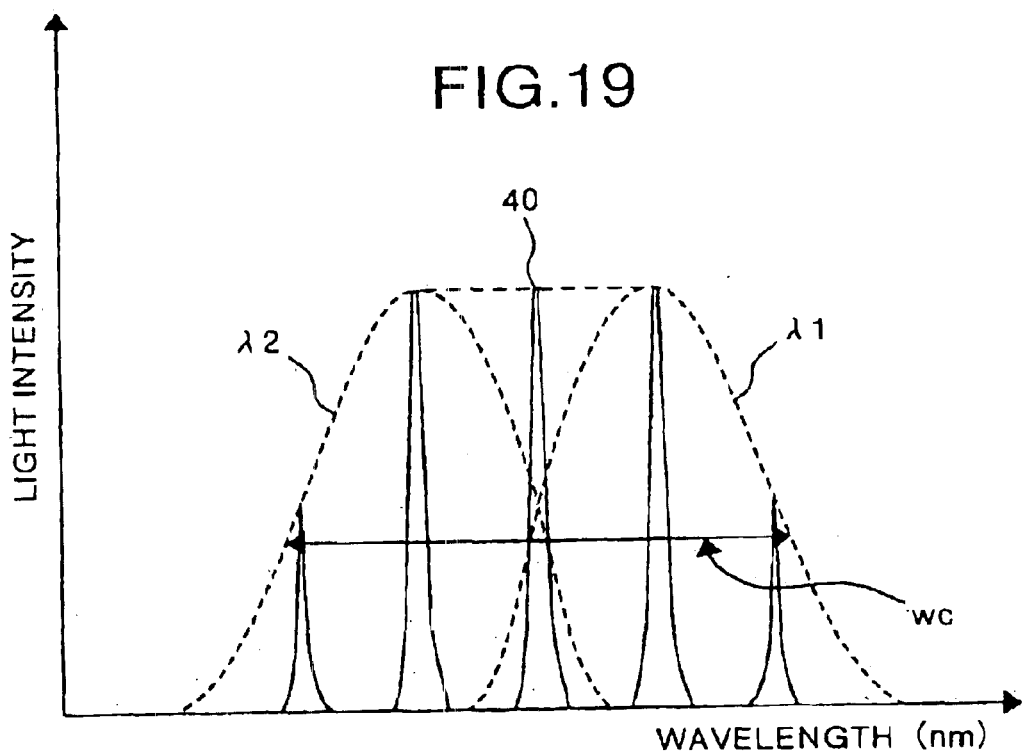
FIG.20
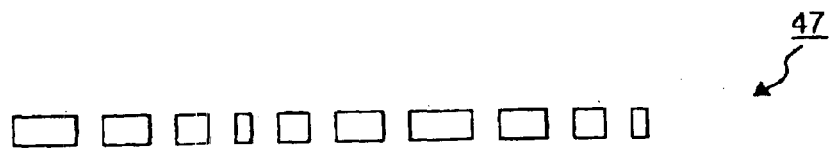
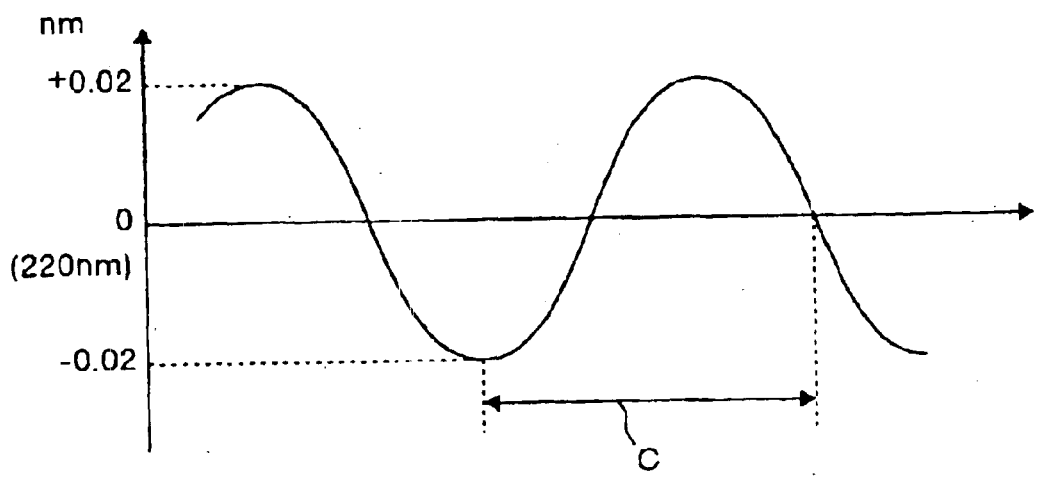

DEVICE AND METHOD FOR PROVIDING A TUNABLE SEMICONDUCTOR LASER

CROSS REFERENCE TO RELATED APPLICATIONS

This application claims the benefit of provisional application No. 60/364,034 Mar. 15, 2002.

This application includes subject matter related to U.S. patent application Ser. No. 09/83,885 filed Apr. 12, 2001, Ser. No. 09/983,175 filed on Oct. 23, 2001, and Ser. No. 09/983,249 filed on Oct. 23, 2001, assigned to The Furukawa Electric Co., Ltd. And the entire contents of these applications are incorporated herein by reference.

FIELD OF THE INVENTION

The present invention relates generally to semiconductor laser device, and in particular to a semiconductor laser device used as a pumping source for an optical amplifier.

BACKGROUND OF THE INVENTION

With the proliferation of multimedia features on the Internet in the recent years, there has arisen a demand for larger data transmission capacity for optical communication systems. Conventional optical communication systems transmitted data on a single optical fiber at a single wavelength of 1310 nm or 1550 nm, which have reduced light absorption properties for optical fibers. However, in order to increase the data transmission capacity of such single fiber systems, it was necessary to increase the number of optical fibers laid on a transmission route, which resulted in an undesirable increase in costs.

In view of this, there has recently been developed wavelength division multiplexing (WDM) optical communications systems such as the dense wavelength division multiplexing (DWDM) system wherein a plurality of optical signals of different wavelengths can be transmitted simultaneously through a single optical fiber. These systems generally use an Erbium Doped Fiber Amplifier (EDFA) to amplify the data light signals as required for long transmission distances. WDM systems using EDFA initially operated in the 1550 nm band which is the operating band of the Erbium Doped Fiber Amplifier and the band at which gain flattening can be easily achieved. While use of WDM communication systems using the EDFA has recently expanded to the small gain coefficient band of 1580 nm, there has nevertheless been an increasing interest in an optical amplifier that operates outside the EDFA band because the low loss band of an optical fiber is wider than a band that can be amplified by the EDFA; a Raman amplifier is one such optical amplifier.

In a Raman amplifier system, a strong pumping light beam is pumped into an optical transmission line carrying an optical data signal. As is known to one of ordinary skill in the art, a Raman scattering effect causes a gain for optical signals having a frequency approximately 13 THz smaller than the frequency of the pumping beam. Where the data signal on the optical transmission line has this longer wavelength, the data signal is amplified. Thus, unlike an EDFA where a gain wavelength band is determined by the energy level of an Erbium ion, a Raman amplifier has a gain wavelength band that is determined by a wavelength of the pumping beam and, therefore, can amplify an arbitrary wavelength band by selecting a pumping light wavelength. Consequently, light signals within the entire low loss band of an optical fiber can be amplified with the WDM communication system using the Raman amplifier and the number of channels of signal light beams can be increased as compared with the communication system using the EDFA.

For the EDFA and Raman amplifiers, it is desirable to have a high output laser device as a pumping source. This is particularly important for the Raman amplifier, which amplifies signals over a wide wavelength band, but has relatively small gain. Such high output is generally provided by a pumping source having multiple longitudinal modes of operation. The Furukawa Electric Co., Ltd. has recently developed an integrated diffraction grating device that provides a high output laser beam suitable for use as a pumping source in a Raman amplification system. An integrated diffraction grating device, as opposed to a fiber brag grating device, includes the diffraction grating formed within the semiconductor laser device itself. Examples of integrated diffraction grating devices are disclosed in U.S. patent application Ser. No. 09/832,885 filed Apr. 12, 2001, Ser. No. 09/983,175 filed on Oct. 23, 2001, and Ser. No. 09/983,249 filed on Oct. 23, 2001, assigned to The Furukawa Electric Co., Ltd. the entire contents of these applications are incorporated herein by reference. While the integrated diffraction grating devices disclosed in these applications provide an improved pumping source for optical amplifiers, the devices are manufactured to output a fixed wavelength. This limits the versatility of the integrated diffraction grating device.

SUMMARY OF THE INVENTION

An object of the present invention is to provide an integrated diffraction grating device having a tunable wavelength output.

Another object of the present invention is to provide a tunable laser device suitable for providing a pumping source to an optical amplifier such as a Raman amplifier.

According to a first aspect of the present invention, a semiconductor laser device and method for providing a light source suitable for use as a pumping light source in a Raman amplification system are provided. The laser device upon which the method is based includes a light reflecting facet positioned on a first side of the semiconductor device, a light emitting facet positioned on a second side of the semiconductor device thereby forming a resonator between the light reflecting facet and the light emitting facet, and an active layer configured to radiate light in the presence of an injection current, the active layer positioned within the resonator. A wavelength selection structure is positioned within the resonator and configured to select a spectrum of the light including multiple longitudinal modes, the spectrum being output from the light emitting facet. Also, an electrode positioned along the resonator and configured to provide the injection current, and a tuning current that adjusts a center wavelength of the spectrum selected by the wavelength selection structure.

The wavelength selection structure may be a diffraction grating positioned along a portion of the active layer in a distributed feedback (DFB) configuration, or positioned within a wavepath layer positioned along a portion of the resonator length where no active layer exists in a distributed Bragg reflector (DBR) configuration. In either configuration, the electrode of the may include a first a first portion configured to provide the injection current and positioned along the active layer where no diffraction grating or wavepath layer exists, and a second portion positioned along the diffraction grating or wavepath layer and configured to supply the tuning current to the diffraction grating. The first and second portions of the electrode may be electrically connected, or electrically insulated so as to be independently adjustable. Moreover, the active layer may be a quantum dot structure and the diffraction grating or wavepath layer may be positioned adjacent to either or both of the light emitting and light reflecting facets.

In yet another aspect of the present invention, a semiconductor laser module, optical fiber amplifier, Raman amplifier, and wavelength division multiplexing system are provided with the semiconductor laser device described above.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 7 is a vertical sectional view in the longitudinal direction of a semiconductor laser device according to a third embodiment of the present invention.

FIG. 19 is a graph illustrating the principle of a composite oscillation wavelength spectrum produced by the combined period Λ1 and Λ2 of FIG. 18;

FIG. 20 illustrates a periodic fluctuation of the grating period of a chirped diffraction grating in accordance with the present invention;

DESCRIPTION OF THE PREFERRED EMBODIMENTS

Figure 1:
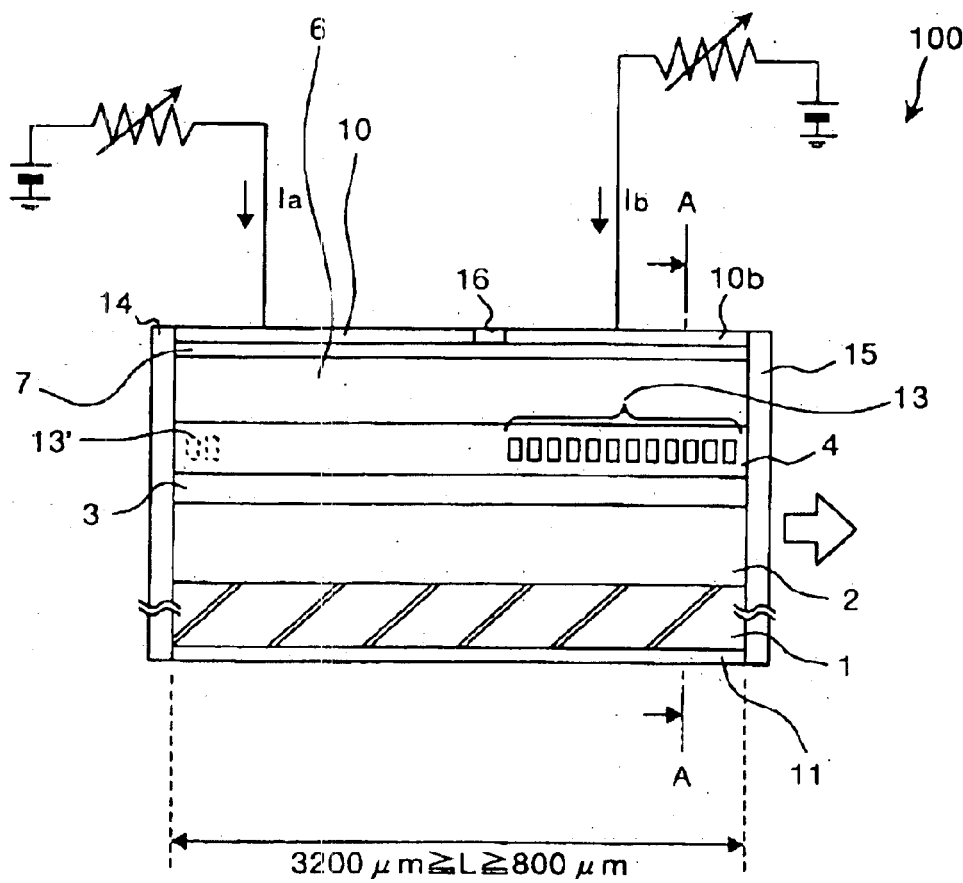
FIG. 1 is a vertical sectional view in the longitudinal direction of a semiconductor laser device according to a first embodiment of the present invention.
Figure 2:
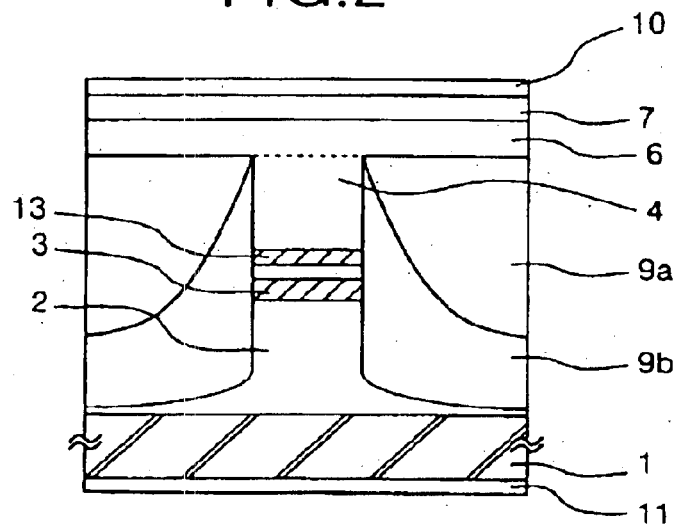
FIG. 2 is a cross sectional view along the line A—A of the semiconductor laser device shown in FIG. 1.

Referring now to the drawings wherein like elements are represented by the same reference designation throughout, and more particularly to FIGS. 1 and 2 thereof, there is shown a semiconductor laser device for providing a light source suitable for use as a pumping light source in a Raman amplification system in accordance with a first embodiment of the present invention. FIG. 1 is a vertical sectional view in the longitudinal direction of the semiconductor laser device, and FIG. 2 is a cross sectional view of the semiconductor laser device, taken along the line A—A in FIG. 1.

The semiconductor laser device 100 of FIGS. 1 and 2 includes an n-InP substrate 1 having an n-InP buffer layer 2, an active layer 3, a p-InP spacer layer 4, a p-InP cladding layer 6, and an p-InGaAsP contact layer 7 sequentially stacked on a face (100) of the substrate 1. Buffer layer 2 serves both as a buffer layer by the n-InP material and an under cladding layer, while the active layer 3 is a graded index separate confinement multiple quantum well (GRIN-SCH-MQW). A diffraction grating 13 of a p-InGaAsP material is periodically formed within the p-InP spacer layer 4 along a portion of the entire length of active layer 3. The diffraction grating 13 of the embodiment of FIG. 1 has a length of approximately 50 µm, a film thickness of 20 nm, a pitch of 220 nm, and selects a laser beam having a central wavelength of 1480 nm, to be emitted by the semiconductor laser device 100. Moreover, as shown in phantom in FIG. 1, the present invention may include a diffraction grating 13' provided on the light reflecting side of the laser device 100.

In addition, a tuning electrode 10b is formed on the upper surface of InGaAsP cap layer 7 along the grating 13, while a light generating electrode 10 is formed along the remaining length of the active layer. The electrode 10 and the electrode 10b are electrically insulated from one another by an electrical separation groove 16. The p-side electrode 10 is supplied by a current source Ia, while the electrode 10b is supplied by a current source Ib.

The electrical separation groove 16 is used to prevent current injected by way of the p side electrode 10 from flowing into to the vicinity of the low reflective film 15 including the diffraction grating 13. While the electrical separation groove 16 shown in FIG. 1 does not reach to p-cladding layer 6, it is preferable to etch off the p-GaInAsP contact layer 7 at groove 16 to realize electrical isolation completely. Where the grating 13' is provided, the electrode 10 may be further divided to provide a separate current electrode to inject current into the area of the grating 13'. Moreover, an n-side electrode 11 is formed on the back surface of n-InP substrate 1.

As best seen in FIG. 2, the p-InP spacer layer 4 having the diffraction grating 13, the GRIN-SCH-MQW active layer 3, and the upper part of the n-InP buffer layer 2 are processed in a mesa strip shape. The sides of the mesa strip are buried by a p-InP blocking layer 9b and an n-InP blocking layer 9a formed as current blocking layers.

As seen in FIG. 1, antireflection coating 15 having low reflectivity of, for example, less than 2% and preferably less than 0.1%, is formed on a light irradiating end surface opposing the light reflecting end surface of semiconductor laser device 20. The reflective film 14 having high reflectivity of, for example, 80% or more, and preferably 98% or more is formed on a light reflecting end surface that is one end surface in the longitudinal direction of the semiconductor laser device 100. In this regard it is noted that when the diffraction grating is formed at the light reflection end, an antireflection film is also preferable as the reflective film 14 in order to suppress reflections from the light reflection end. The reflective film 14 and the diffraction grating 13 including the antireflection coating 15 form a light resonator within the active region 3 of the semiconductor laser device 20. A light beam generated inside the GRIN-SCH-MQW active layer 3 of the light resonator is reflected by the reflective film 14 and irradiated as an output laser beam via the antireflection coating 15. As seen in FIG. 1, the resonator length L is preferably from 800–3200 μm in order to provide multiple longitudinal modes in the light emitting spectrum selected by the grating 13 of the laser device.

Figure 3:
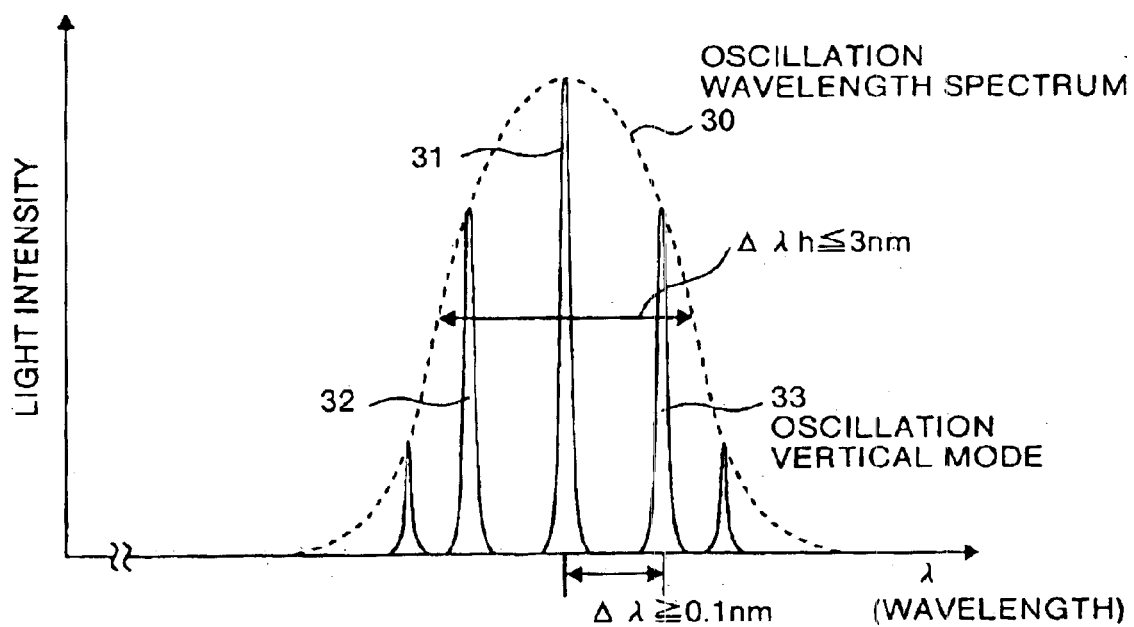
FIG. 3 shows the oscillation wavelength spectrum of a semiconductor laser device in accordance with the present invention.

FIG. 3 shows the oscillation wavelength spectrum of the light output of a diffraction grating semiconductor laser device in accordance with the present invention. As seen in this figure, the oscillation wavelength spectrum 30 provides multiple longitudinal modes including center frequency mode 31, and modes 32 and 33, separated by a wavelength interval Λλ. The oscillation wavelength spectrum 30 determines the output wavelength of the laser device. U.S. patent application Ser. Nos. 09/832,885, 09/983,175 and 09/983,249 disclose various methods for providing multiple longitudinal modes within the wavelength oscillating spectrum to achieve higher output power for Raman amplification. The entire content of these applications is incorporated herein by reference. While the techniques of these applications are applicable to the present invention, the present invention improves on these devices by providing tunability for the multiple mode spectrum.

Specifically, the present inventors have recognized that current changes within the area of the diffraction grating 13 cause changes in the wavelength selection characteristics of the laser device. This is due to a plasma effect wherein the refractive index of a material changes in relation to the carrier density of the material. Moreover, the changes in current cause a change in temperature that also changes the refractive index of the diffraction grating. In this regard, there is trade off relation between plasma effect and thermal effect on reflective index change. That is, when the plasma effect is dominant, refractive index is decreased, and on the other hand, when the thermal effect is dominant, refractive index is increased. Thus, the refractive index of the p-InGaAsp and the p-InP spacer layer 4 forming the diffraction grating 13 is changed by the injecting of the current Ib. Therefore, the optical path length is longer compared to when Ib=0 and the effective period of the diffraction grating 13 changes. Therefore, when Ib≠0, the central wavelength selected by the diffraction grating 13 changes in response to the changes in the value of Ib.

Accordingly, the semiconductor laser device according to the first embodiment is able to control the central wavelength and multiple mode spectrum selected by controlling the value of Ib. As a result, for example, even if an actually manufactured semiconductor laser device is not able to select the central wavelength it was designed to select at the design stage, by controlling the value of Ib, it is possible for the desired central wavelength to be selected. In one embodiment, the tuning range is about 2–3 nm. Therefore, the yield of the semiconductor laser device according to the first embodiment can be improved. Moreover, even if a central wavelength that is different from the central wavelength assumed at the design stage is desired, it is possible for the desired central wavelength to be selected by controlling the value of Ib. Finally, due to the electrical separation groove 16, it is possible to vary Ia, which controls the light output, irrespectively of Ib, which controls the central wavelength selected by the diffraction grating 13. Thus, the light output of the semiconductor laser device can be arbitrarily changed while keeping the central wavelength constant.

Figure 4:
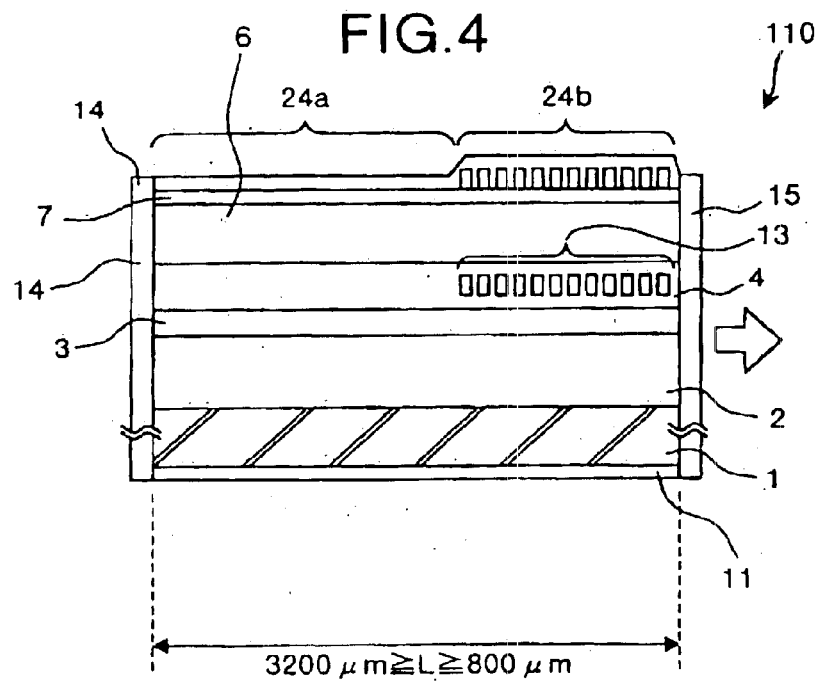
FIG. 4 is a vertical sectional view in the longitudinal direction of a semiconductor laser device according to a second embodiment of the present invention.

FIG. 4 is side cross-sectional view showing the structure of a semiconductor laser device according to a second embodiment of the present invention. The semiconductor laser device 110 according to the second embodiment is provided in the same way as the semiconductor laser device according to the first embodiment, with a structure in which an n-InP cladding layer 2, a GRIN-SCH-MQW active layer 3, a p-InP spacer layer 4, a p-InP cladding layer 6, and a p-InGaAsP contact layer 7, are superposed in that order on a (100) surface of an n-InP substrate 1. In addition, an n side electrode 11 is provided below the n-InP substrate 1. Furthermore, antireflective film 15 is provided on the laser light emission side end surface (the right side in FIG. 4), and a high reflective film 14 is provided at the end surface on the opposite side (the left side in FIG. 4). In the same way as in the first embodiment, the light reflectance of the high reflective film 14 is 80% or more, while the light reflectance of the low reflective film 15 is 1% or less. A diffraction grating having an identical period as the grating 13 is provided in the vicinity of the low reflective film 15 and inside the p-InP spacer layer 4. However, deviations in the period of the gratings may occur during fabrication of the laser device.

A p side electrode 24 is provided above the p-InGaAsP contact layer 7. Here, the p side electrode 24 can be considered as being divided into a p side electrode 24b in the area corresponding to the top of the diffraction grating 13 and a p side electrode 24a in the remaining area. The p side electrode 24a uniformly coated on top of the p-InGaAsP contact layer 7, while the p side electrode 24b has a comb shape structure using dielectric electrical separation grooves in which the teeth are in contact with the p-InGaAsP contact layer 7. In an alternative embodiment, this comb shape structure could also be made of semiconductor current blocking layer.

Accordingly, the current does not flow uniformly under the p side electrode 24b and the current density changes in accordance with the comb shape structure.

As described for the first embodiment, changes in the refractive index are generated in the diffraction grating 13 and in the areas peripheral thereto in accordance with the magnitude of the inflowing current. Thus, while the physical structure of the diffraction circuit 13 has a single period (i.e. a constant pitch and spacing), the refractive index changes in accordance with changes in the density of the current injected from the p side electrode 24b, which causes the optical path length to change in this area. Accordingly, the diffraction grating 13 effectively takes on the form of a collection of diffraction gratings having different periods, and each period is controlled by the size of the current injected via the p side electrode 24b.

Figure 5A:
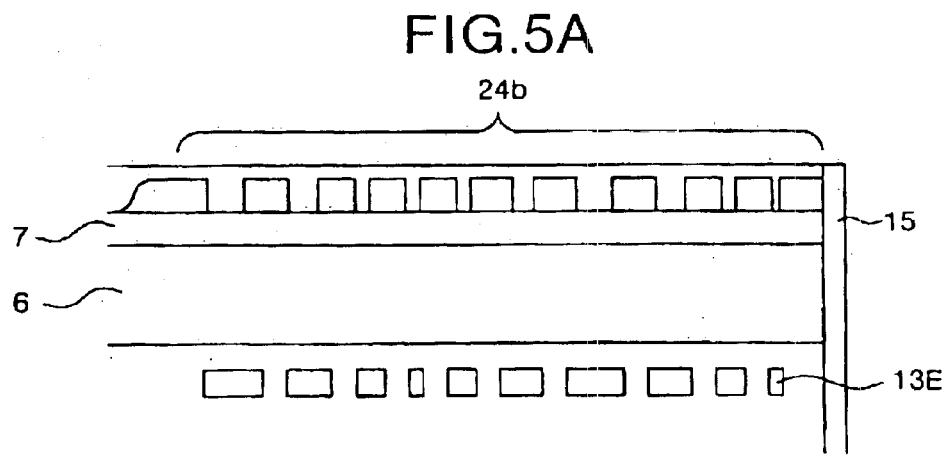
FIGS. 5A and 5B show an example of the effective grating that results from current changes introduced by including a grating structure in the p-side electrode.
Figure 5B:
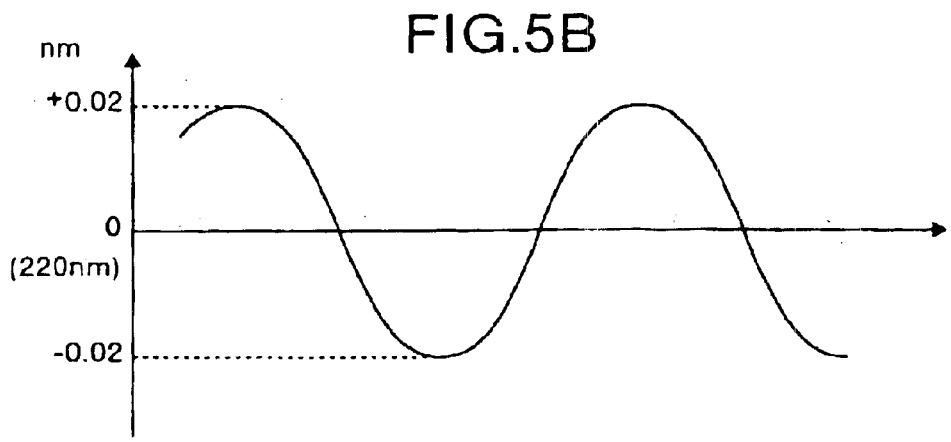

FIGS. 5A and 5B show an example of the effective grating 13E that results from the current changes introduced by the comb or grating structure in the p side electrode area 24b. In the comb shape structure of the p side electrode 24b, the pitch of the teeth changes periodically. Therefore, by injecting current from the p side electrode 24b, the diffraction grating 13 is effectively given a structure such as that shown in FIG. 5A, if the refractive index change due to the injection current is additionally considered. Namely, because the injection currents fluctuates in correspondence with the pitch of the teeth of the comb of the p side electrode 24b, the size of each grating forming the diffraction grating 13 changes in the direction in which the laser light is emitted in accordance with the size of the current. By periodically changing the pitch of the teeth of the p side electrode 24b, in essence, the grating period of the diffraction grating 13E is periodically changed to what is known as a chirped grating, such as that shown in FIG. 5A and FIG. 5B. By providing the diffraction grating 13 with this type of chirped grating structure, fluctuation in the wavelength selectivity of the diffraction grating 13 is generated and the half width of the oscillation wavelength spectrum is made wider, enabling the number of oscillation longitudinal modes inside the half width to be increased.

Figure 6A:
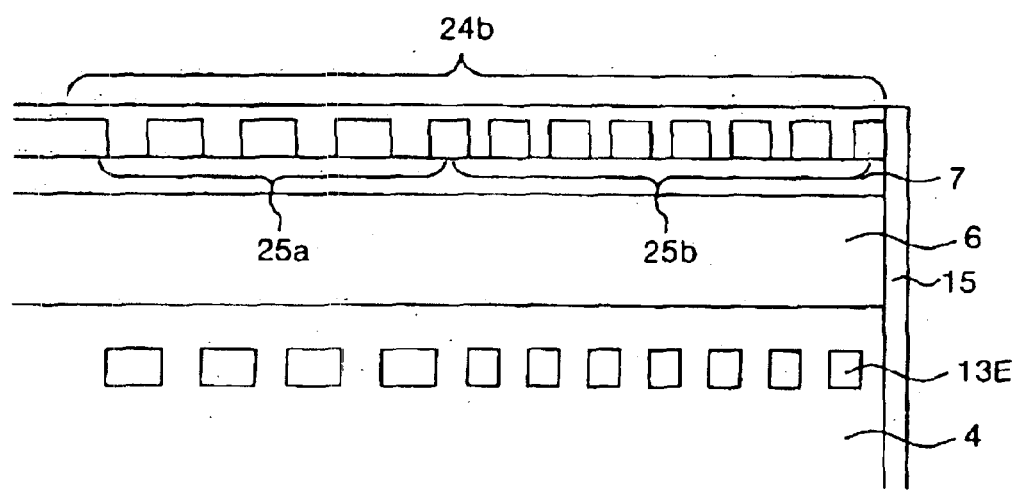
FIGS. 6A and 6B show a second example of the effective grating that results from current changes introduced by including a grating structure in the p-side electrode.

FIG. 6A shows another example of a structure in which the p side electrode 24b is further divided to form a p side electrode 25a in which the comb shape structure has the period $\Lambda 1$, and a p side electrode 24b having a p side electrode 25b in which the comb shape structure has the period $\Lambda 2$ ($\neq \Lambda 1$). In this case, the current density flowing from the p side electrode 25a is different from that of the current flowing from the p side electrode 25b. As a result of this difference in the current densities, when considering the refractive index change due to the injection current, the diffraction grating 13E is divided into a portion having the effective cycle $\Lambda 1$ and a portion having the effective cycle $\Lambda 2$ ($\neq \Lambda 1$). Accordingly, two different central wavelengths $\lambda 1$ and $\lambda 2$ are selected by the diffraction grating 13, and the spectrum of the oscillating laser light takes on the form of a composite oscillation wavelength spectrum, such as is shown in FIG. 6B.

Figure 6B:
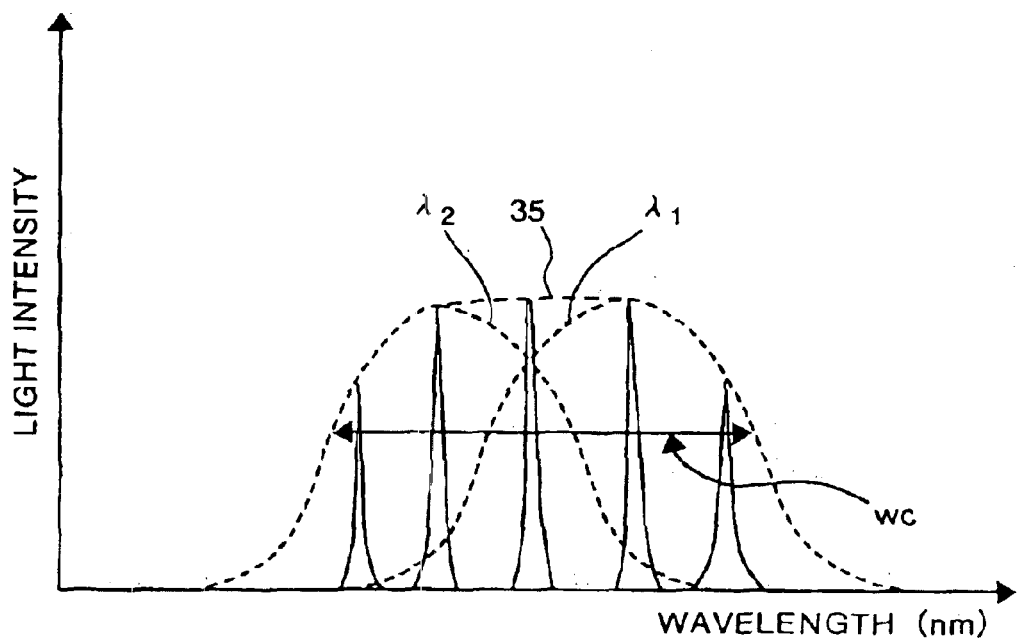

In FIG. 6B, the oscillation wavelength spectrum of the wavelength $\Lambda 1$ is formed by the portion of the period $\Lambda 1$ and three oscillation modes are selected within this oscillation wavelength spectrum. On the other hand, the oscillation wavelength spectrum of the wavelength $\lambda 2$ is formed by the portion of the period $\Lambda 2$ and three oscillation modes are selected within this oscillation wavelength spectrum. As also seen in FIG. 6B, a structure is employed in which the oscillation modes on the shorter wavelength side of the central wavelength $\lambda 1$ overlap the oscillation vertical modes on the longer wavelength side of the central wavelength $\lambda 2$. Thus, the design of electrode 25a and 25b controls an overlap area at which a central wavelength mode will oscillate, thereby effectively tuning the central mode. Moreover, four to five oscillation vertical modes are contained within the composite width Wc of the composite oscillation wavelength spectrum 35 formed by the diffraction grating of the periods $\Lambda 1$ and $\Lambda 2$. As a result, compared with when a plurality of longitudinal oscillation modes are formed based on a single central wavelength, the selection and output of an even greater number of longitudinal oscillation modes can be performed easily bringing about an increase in the light output.

FIG. 7 is a side cross-sectional view showing the structure of a semiconductor laser device according to a third embodiment of the present invention. In FIG. 7, those portions that are the same as or similar to portions in FIG. 1 and FIG. 4 are not described. As seen in FIG. 7, the semiconductor laser device 120 according to the third embodiment has a p side electrode disposed on a p-InGaAsP contact layer 7. The p side electrode is formed by a uniformly accumulated p side electrode 27a and a comb structure p side electrode 27b. An electrical separation groove 26 is provided between the p side electrodes 27a and 27b. As a result, the currents Ia and Ib injected from the p side electrodes 27a and 27b can be controlled independently of each other. As noted above, while the electrical separation groove 26 shown in FIG. 7 does not reach to p-cladding layer, it is preferable to etch off the p-GaInAsP contact layer 7 at groove 26 to realize electrical isolation completely.

As a result of the semiconductor laser device according to the third embodiment having a structure in which the p side electrodes 27a and 27b are electrically isolated, it has the same advantages as the semiconductor laser device according to the first embodiment. Namely, because it is possible to hold Ib at a constant value irrespective of the variable Ia in order to control the output of the semiconductor laser device, it is possible to obtain a specific wavelength oscillation using Ib. In addition, because it is possible to control the current Ib and the current Ia, independently of each other, it is also possible to change the selected central wavelength while keeping the output light of the semiconductor laser device constant.

Furthermore, as the semiconductor laser device according to the third embodiment has the p side electrode 27b having a comb shape structure, it has the following same advantages as the semiconductor laser device according to the second embodiment. Namely, due to the comb shape structure, the density of the current flowing into the diffraction grating 13 is not uniform and differs depending on the location. Therefore, changes in the refractive indexes of each grating forming the diffraction grating 13 and in the areas peripheral thereto are not uniform and depend on the comb shape structure. Therefore, by providing the comb shape structure, for example, with the patterns shown in FIGS. 5A and 6A, the same effects can be obtained as when the period and the like of the diffraction grating 13 is changed. It is thus possible to provide a semiconductor laser device having effectively chirped grating structure and having two or more different selection wavelengths.

Figure 8:
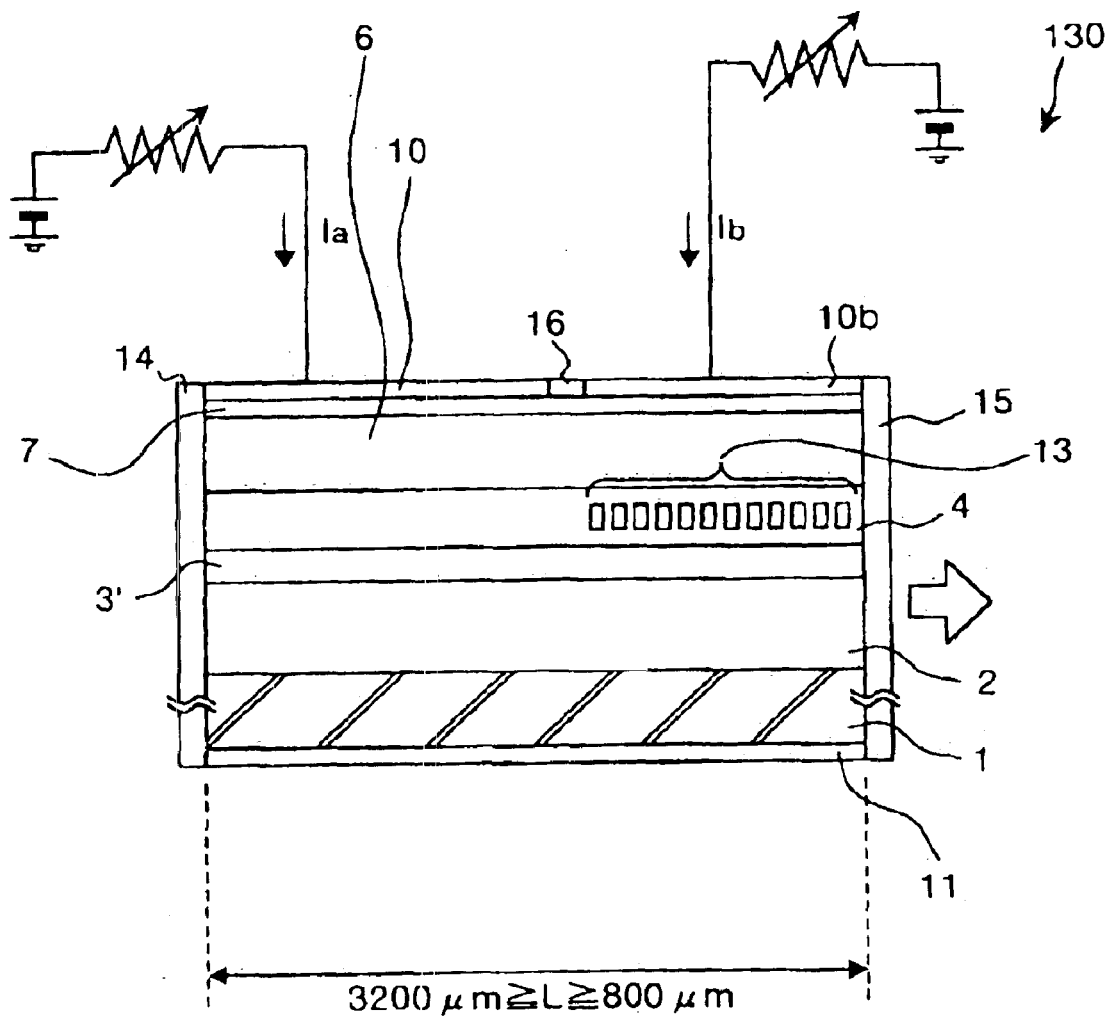
FIG. 8 is a vertical sectional view in the longitudinal direction of a semiconductor laser device according to a fourth embodiment of the present invention.

FIG. 8 is a side cross-sectional view showing the structure of a semiconductor laser device 130 according to a fourth embodiment of the present invention. FIG. 8 is substantially identical to the structure of FIG. 1, with the exception of the active layer 3'. In the embodiment of FIG. 8, the active layer 3' comprises a self-organized Quantum dot structure. The effect of the quantum dot structure on the wavelength range of a single mode laser has been described in InAs/GaInAs quantum dot DFB lasers emitting at 1.3 µm, Klopf et al., IEEE Electronics Letters, Vol. 37, No. 10 (10 May, 2001), and InGaAs/AlGaAs quantum dot DFB lasers operating up to 213° C., Kamp et al., IEE Electronics Letters, Vol. 35, N. 3 (Nov. 11, 1999), the entire content of these references being incorporated herein by reference. According to this structure, the active layer 3' has an inhomogeneously broadened optical gain spectrum due to a size fluctuation of the dots, and therefore offers a wider range of gain than quantum well lasers. Thus, a tuning range of approximately 40 nm, for example, may be achieved for the center wavelength. However, the precise tuning range is determined by the size fluctuation of the self-assembled dot which depends on the growth conditions. As with embodiments previously discussed, this tuning range is achieved by varying the current in the area of the grating 13. Finally, as previously noted, while the electrical separation groove 16 shown in FIG. 8 does not reach to p-cladding layer, it is preferable to etch off the p-GaInAsP contact layer 7 at groove 16 to realize electrical isolation completely.

Figure 9:
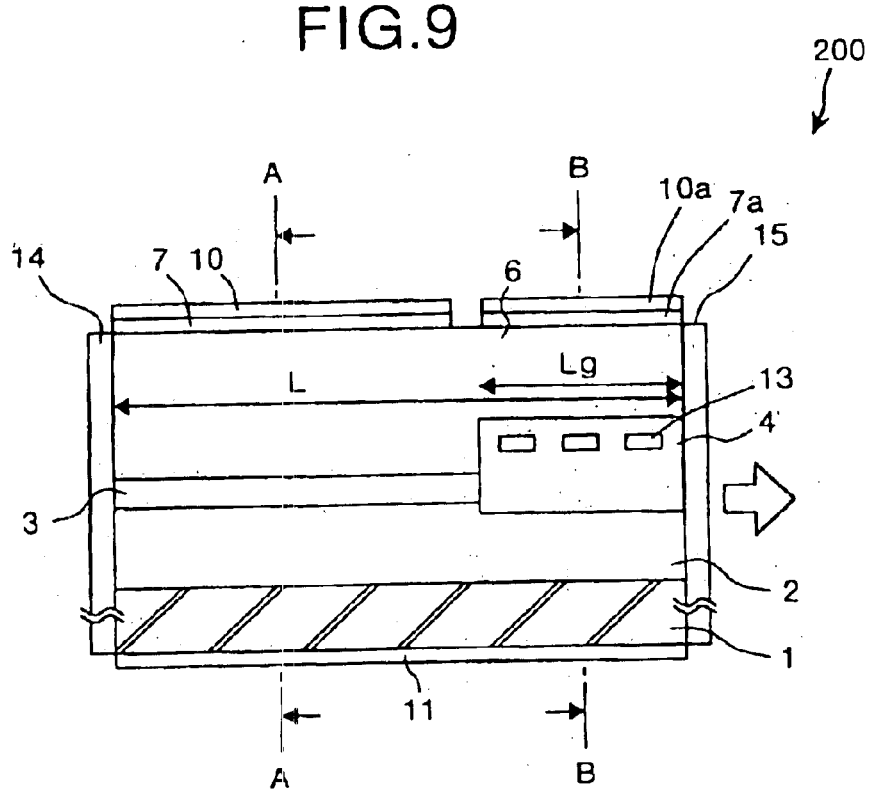
FIG. 9 is a vertical sectional view in the longitudinal direction of a semiconductor laser device in accordance with a fifth embodiment of the present invention.
Figure 10:
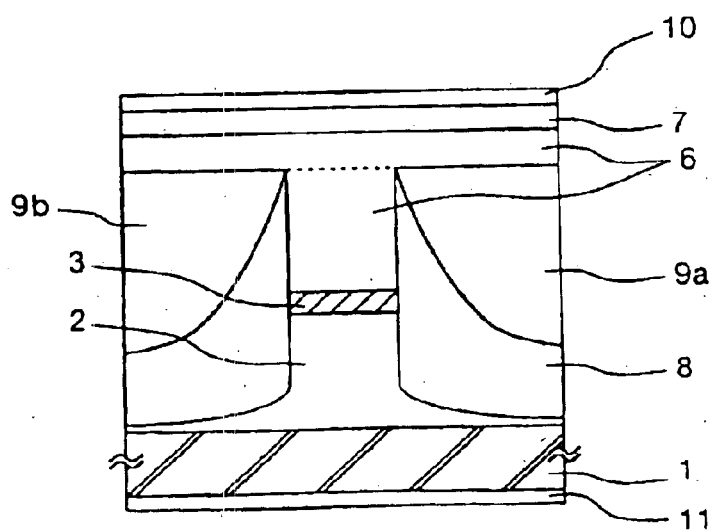
FIG. 10 is a cross sectional view of the semiconductor laser device, taken along the A—A line of FIG. 9.
Figure 11:
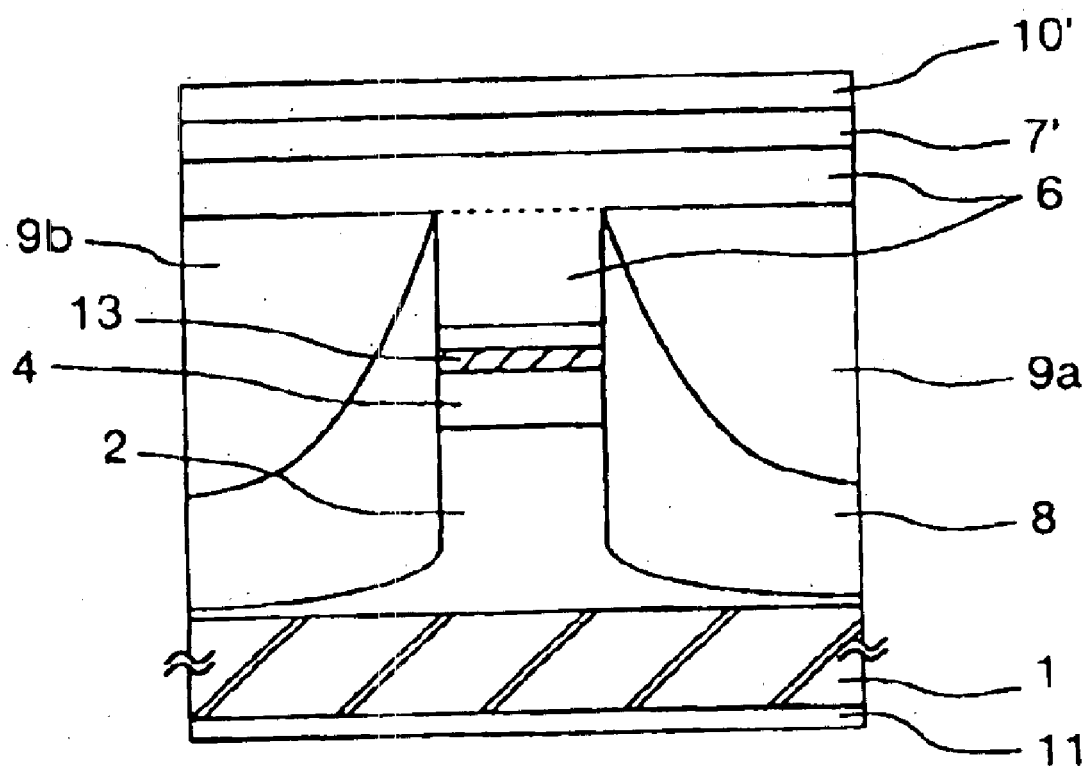
FIG. 11 is a cross sectional view of the semiconductor laser device, taken along line B—B in FIG. 9.

In the embodiments of the present invention described with respect to FIGS. 1–8, the grating structure 13 is provided along the active layer. The present inventors have recognized, however, that placing the grating along the active layer in a DFB configuration may cause an undesirable change in wavelength or intensity of the light (i.e. kinks in L/I characteristics) emitted from the active layer due to changes of the injection current to the grating positioned along the active layer. FIGS. 9–11 show a DBR semiconductor laser device for providing a wavelength tunable light source suitable for use as a pumping light source in a Raman amplification system. FIG. 9 is a vertical sectional view in the longitudinal direction of a semiconductor laser device in accordance with a fifth embodiment of the present invention, FIG. 10 is a cross sectional view of the semiconductor laser device, taken along the line A—A in FIG. 9, and FIG. 11 is a cross sectional view of the semiconductor laser device, taken along the line B—B in FIG. 9.

The semiconductor laser device 200 of FIGS. 9–11 includes an active region for generating light by radiation recombination, and a wavelength selection region for determining a wavelength of the light output from the laser device 200 and multimode oscillation. The active region is situated on the left side of the device illustrated in FIG. 9 and includes an n-InP substrate 1 having an n-InP buffer layer 2, an active layer 3, a p-InP cladding layer 6, and a p-InGaAsP contact layer 7 sequentially stacked on a face (100) of the substrate 1. Buffer layer 2 serves both as a buffer layer by the n-InP material and an under cladding layer, while the active layer 3 is a graded index separate confinement multiple quantum well (GRIN-SCH-MQW) having a compression strain of 1%, for example. However, where the quantum well has higher strain amount over 1%, a strain compensated structure wherein a barrier layer of the MQW is tensile-strained, is preferable.

The wavelength selection region is situated on the right side of the device illustrated in FIG. 9 and includes the n-InP substrate 1 having the n-InP buffer layer 2, a GaInAsP light guiding wavepath layer 4, of which bandgap wavelength is larger than the oscilation wavelength, the p-InP cladding layer 6, and a p-InGaAsP contact layer 7a sequentially stacked on a face (100) of the substrate 1. A diffraction grating 13 of a p-InGaAsP material is periodically formed within the wavepath layer 4. In case of undoped GaInAsP wavepath layer 4, an undoped diffraction grating may be used. In case of doped GaInAsP diffraction grating, a p type GaInAsP wavepath layer stacked over the grating is preferable.

The diffraction grating 13 of the embodiment of FIG. 9 has a length Lg of approximately 250 µm, a film thickness of 20 nm, a pitch of 220 nm, and selects a laser beam having a central wavelength of 1480 nm to be emitted by the semiconductor laser device 200. It is desirable that the grating material of the diffraction grating 13 be placed in contact with the emission side reflective film 15. However, it is not absolutely necessary for the grating to contact the film 15, and it is also possible for the grating to be placed within the range where it fulfills the wavelength selection function of the diffraction gratings 13. For example, the grating material may be placed at a distance from the emission side reflective membrane 15 that is within the range of approximately 20 µm to 100 µm.

As best seen in FIGS. 10 and 11, the wavepath layer 4 having the diffraction grating 13, the GRIN-SCH-MQW active layer 3, and the upper part of the n-InP buffer layer 2 are processed in a mesa strip shape. The sides of the mesa strip are buried by a p-InP blocking layer 9b and an n-InP blocking layer 9a formed as current blocking layers. In addition, a p-side electrode is formed on the upper surface of p-InGaAsP contact layer 7, and an n-side electrode 11 is formed on the back surface of n-InP substrate 1. The p-side electrode includes an electrode 10 formed on the upper surface of the contact region 7 in the active region of the device, and an electrode 10a formed on the upper surface of the contact region 7a in the wavelength selection region of the device.

As seen in FIG. 9, reflective film 14 having high reflectivity of, for example, 80% or more, and preferably 98% or more is formed on a light reflecting end surface that is one end surface in the longitudinal direction of the semiconductor laser device 200. Antireflection coating 15 having low reflectivity of, for example, less than 2% and preferably less than 0.1%, is formed on a light irradiating end surface opposing the light reflecting end surface of semiconductor laser device 200. When the diffraction grating is formed at the light reflection end, an antireflection film is also preferable as a reflective film 14 in order to suppress the reflection from the light reflection end. The reflective film 14 and the diffraction grating 13 including the antireflection coating 15 form a light resonator within the active region 3 of the semiconductor laser device 200. The resonator length L is preferably from 800–3200 µm in order to provide multiple longitudinal modes within the gain profile of the laser device. A light beam generated inside the GRIN-SCH-MQW active layer 3 of the light resonator is reflected by the reflective film 14 and irradiated as an output laser beam via the antireflection coating 15. The light is emitted after undergoing wavelength selection by the diffraction grating 13 provided within the light guiding wavepath layer 4. As with the DFB laser device of FIGS. 1–8, the DBR laser structure of FIGS. 9–11 is configured to provide a stable multiple mode oscillation as shown in FIG. 3.

As noted above, the present inventors have recognized that current changes within the area of the diffraction grating 13 changes the wavelength selection characteristics of the laser device. This is due to a plasma effect wherein the refractive index of a material changes in relation to the carrier density of the material. Moreover, the changes in current cause a change in temperature that also changes the refractive index of the diffraction grating. Therefore, with the DFB configuration described in FIGS. 1–8, changes in the injection current of the grating region to change the wavelength output of the device also changes the light output of the device due to current changes in the active region where the grating is placed.

The present inventors have discovered that by separating the active region from the wavelength selection region in a DBR configuration as shown in FIG. 9, a more stable and efficient output can be achieved. Specifically, because the diffraction grating 13 is placed within the wavepath layer 4 in front of the active layer 3, rather than along the active layer, the wavelength selection region acts as a passive device preventing undesirable wavelength shifts caused by longitudinal mode hopping, which is that occur due to refractive index changes by injection current in the diffraction grating 13. Moreover, because the active region and the wavelength selection region of the device according to the present invention have independent p-side electrodes, these portions of the device can be current controlled separately. That is, the injection current to the active region of the device can be controlled to affect the light output, while the injection current to the wavelength selection region can be controlled to affect wavelength selection thereby providing a tunable laser. In this regard, the materials of the wavepath layer 4 and the diffraction grating 13 can be selected according to how the refractive index of these materials change for different current applications.

Figure 12:
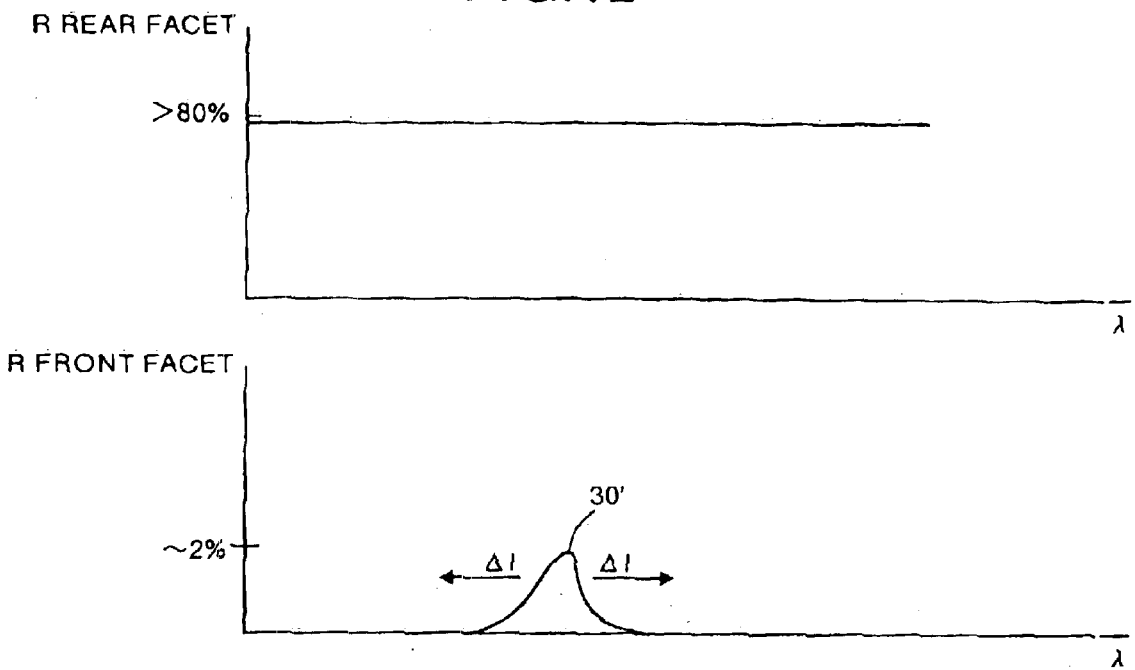
FIG. 12 is a graph showing the reflectivity characteristics of a tunable laser in accordance with the embodiment of the laser shown in FIGS. 9–11.

FIG. 12 shows the reflectivity characteristics of a tunable laser in accordance with the embodiment of the invention shown in FIGS. 9–11. As seen in this figure, the light reflecting end of the laser device (shown on the left in FIG. 9) has a reflectivity of at least 80% and remains substantially constant over wavelength. This is because the reflectivity from the light reflecting end is provided by a reflective coated cleaved facet that does not have a wavelength selectivity characteristic in the range of the oscillation wavelength.

Figure 13:
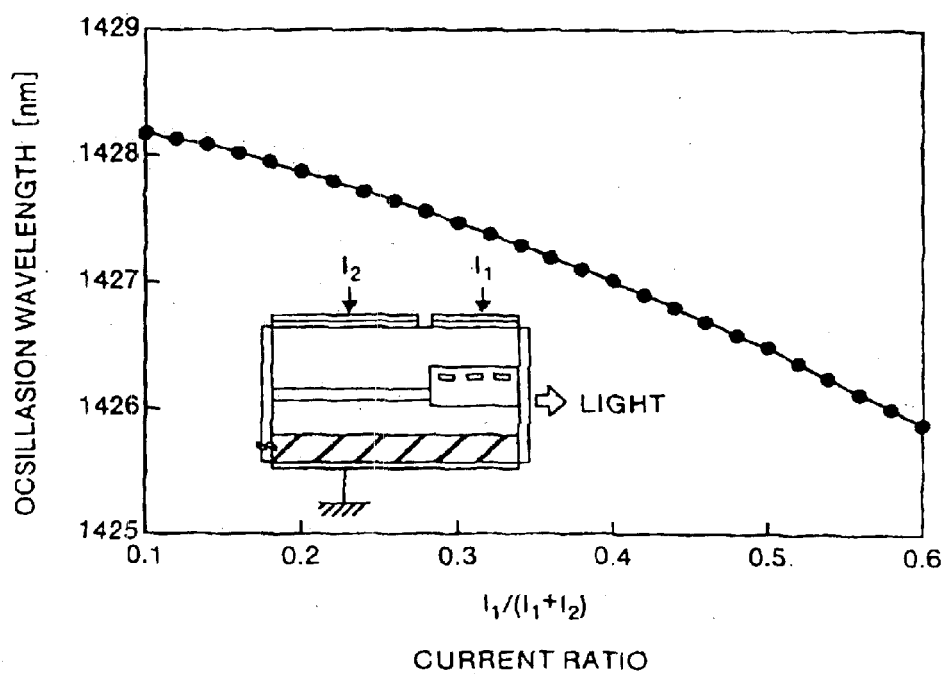
FIG. 13 is a graph showing an example of a wavelength change that can be achieved by a change in injection current in accordance with an embodiment of the present invention.

As also seen in FIG. 12, however, the reflective property of the light emitting end of the laser device has a wavelength selective characteristic due to the grating 13. The physical characteristics of the grating are selected such that the grating reflects a bandwidth of light sufficient to allow multiple mode oscillations as shown in FIG. 3. Thus, the reflectivity curve 30' in FIG. 12 corresponds to the oscillation wavelength spectrum 30 in FIG. 3. As also seen in FIG. 12, the reflectivity curve 30' may be shifted by a wavelength corresponding to a current value injected into the grating region by way of the electrode 10a in FIG. 9. FIG. 13 shows an example of a wavelength change that can be achieved by a change in injection current. As seen in this figure, a tuning range of more than 2 nm can be achieved by injecting current into the grating region.

Figure 14A:
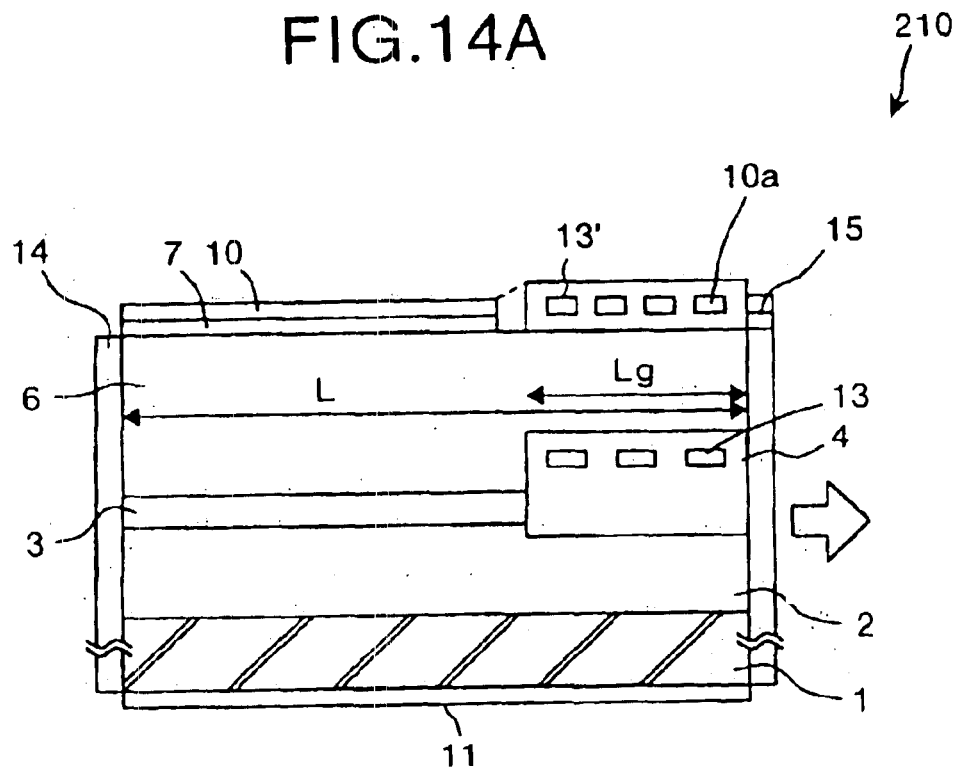
FIG. 14A is a vertical sectional view in the longitudinal direction, of a semiconductor laser device according to a sixth embodiment of the present invention.

FIG. 14A is a vertical sectional view in the longitudinal direction of the semiconductor laser device according to a sixth embodiment of the present invention. The sixth embodiment of the invention includes all of the components of the fifth embodiment which were described with respect to FIG. 9 and these descriptions are not repeated here. However, as seen in FIG. 14A, the sixth embodiment also includes a grating or comb structure 13' embedded in the p side electrode 10a. The electrode 10a having the comb structure 13' may be electrically isolated from the electrode 10, or electrically connected as shown in phantom in FIG. 14A. The grating structure 13' is similar to the structure discussed with respect to the DFB configuration in FIGS. 4–7. That is, with the electrode grating 13', the current injected into the area of the grating 13 within the wavepath layer 4 is non-uniform. Thus, while the grating 13 has a uniform physical period, the refractive index change of the grating 13 and wavepath layer 14 due to the varying injection current causes the grating 13 to have an optical period that is effectively chirped.

Figure 14B:
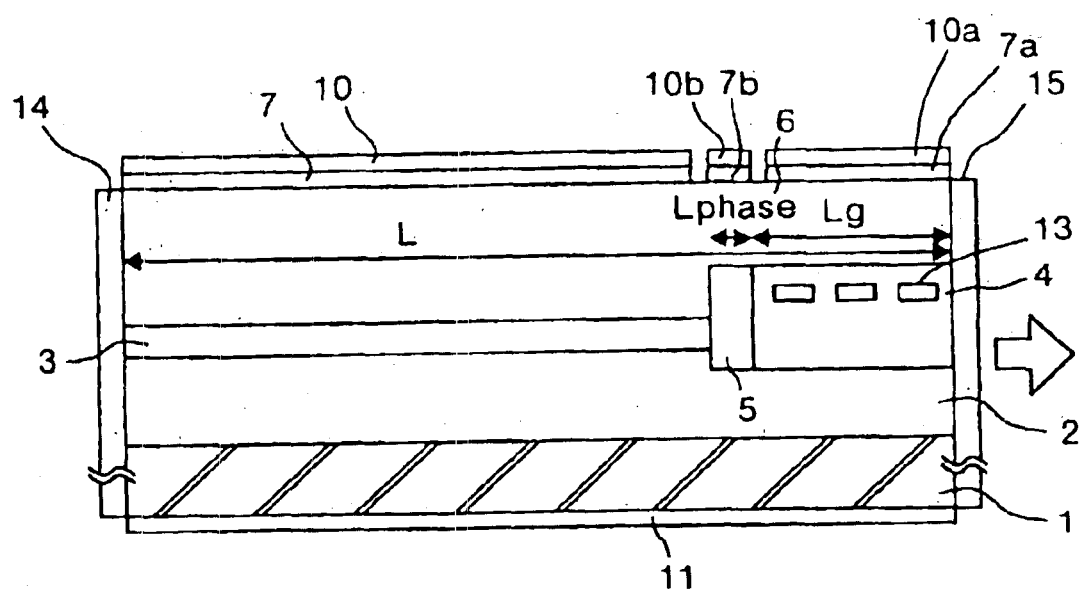
FIG. 14B is a vertical sectional view in the longitudinal direction of a semiconductor laser device according to a seventh embodiment of the present invention.

FIG. 14B is a vertical sectional view in the longitudinal direction of a semiconductor laser device according to a seventh embodiment of the present invention. The seventh embodiment of the invention includes all of the components of the fifth embodiment which were described with respect to FIG. 9 and these descriptions are not repeated here. However, as seen in FIG. 14B, the second embodiment also includes a phase matching portion interposed between the active region and the wave selection region. Specifically, the phase matching region includes the n-InP substrate 1 having the n-InP buffer layer 2, a light guiding wavepath layer 5, p-InP cladding layer 6, a p-InGaAsP contact layer 7b, and p-side electrode 10b sequentially stacked on a face (100) of the substrate 1. Thus, the current in the phase selection region is also independently controllable. The present inventors have recognized that this independent control allows for more efficient operation of the semiconductor laser device.

Specifically, the present inventors recognized that while a laser according to FIGS. 9 and 14A embodiment provides a tunable laser output, the different refractive indices of the active region and the wavelength selection region cause a phase mismatch at the boundary between these layers. This phase mismatch causes lower output power. That is, light traveling from the reflective film 14 toward the reflective film 15 first travels through the active layer 3 having a first refractive index, and then through the wavepath layer 4 having a second refractive index. The portion of the light reflected by the film 15 and the diffraction grating 13 travels through the wavepath layer 4 back towards the film 14. Because the refractive index of the wavepath layer 4 is different than the active layer 3, this returning light may be out of phase with the light being generated by the active layer reducing the output of the device and resulting unstable multi-mode operation that causes longitudinal mode hopping exhibited by a kink in the current versus optical output curve. However, with the phase selection region of the seventh embodiment shown in FIG. 14B, the current in this region is independently controlled to change the refractive index of the material 5 thereby adjusting the phase of a lightweight traveling through this material. That is, by changing the current in the phase matching region, the refractive index of the material 5 changes, thereby providing phase matching between the active region and the wavelength selecting portion of the semiconductor laser device.

While the embodiments described with respect to FIGS. 9–14 show the grating positioned on the light emitting side of the laser device, one of ordinary skill in the art would understand that the grating that provides tunability of the laser may be provided on the light reflecting side rather than the light emitting side of the semiconductor laser device. In this configuration, the light reflecting grating would provide a relatively high reflectivity, while the facet 14 would have a low reflectivity to suppress Fabry-Perot oscillations. Moreover, while the DBR lasers of FIGS. 9–14 have been described with respect to a quantum well active layer 3, the active layer may be a quantum dot structure as described with respect to the configuration of FIG. 8.

Figure 15A:
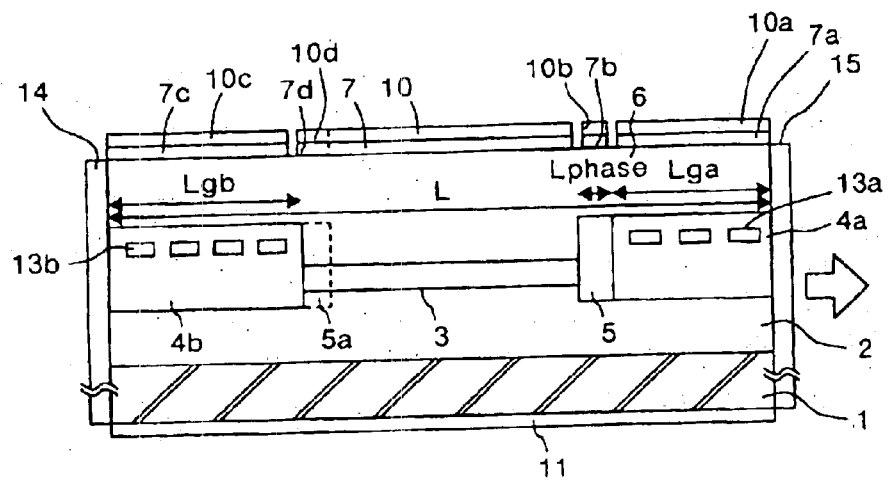
FIG. 15A is a vertical sectional view in the longitudinal direction of a semiconductor laser device according to an eighth embodiment of the present invention.

FIG. 15A is a vertical sectional view in the longitudinal direction of a semiconductor laser device according to an eighth embodiment of the present invention. The eighth embodiment of the invention includes all of the components of the seventh embodiment which were described with respect to FIG. 14B and therefore not described here. However, as seen in FIG. 15A the eighth embodiment includes a second diffraction grating within a light guiding wavepath on the light reflecting side of the semiconductor laser device. Specifically, the region of the second light guiding wavepath includes the n-InP substrate 1 having the n-InP buffer layer 2, a light guiding wavepath layer 4b, the p-InP cladding layer 6, a p-InGaAsP contact layer 7c, and p-side electrode 10c sequentially stacked on a face (100) of the substrate 1. A diffraction grating 13b of a p-InGaAsP material is periodically formed within the wavepath layer 4b. The diffraction grating 13B of the embodiment of FIG. 1 has a length Lgb. As with the diffraction grating on the light emitting side, it is desirable that the diffraction gratings 13b be placed in contact with the reflective film 14, however, it is not absolutely necessary for them to be placed in contact therewith. It is also possible for the grating 13b to be placed within a range where it fulfills the function of a diffraction gratings.

Application Ser. No. 09/983,249 incorporated herein discloses various techniques for placing the diffraction grating on the light reflecting side of the resonant cavity to achieve improved output efficiency of the laser device. While the techniques of this application are applicable to the device of FIG. 15A, the present invention improves over these devices by making the current in the light reflecting grating independently controllable. Applicants have discovered that by changing the current in the light reflecting grating region, the refractive index of the material 13b changes, thereby providing another degree of adjustment of the wavelength oscillation profile. Moreover, the wavepath layer 4b may be positioned adjacent to a second phase selection region 5b shown in phantom in FIG. 15A. When the second phase selection region is used, an electrically independent electrode is provided for the second phase selection region as illustrated by contact layer 7d and electrode 10d also shown in phantom in FIG. 15A.

Figure 15B:
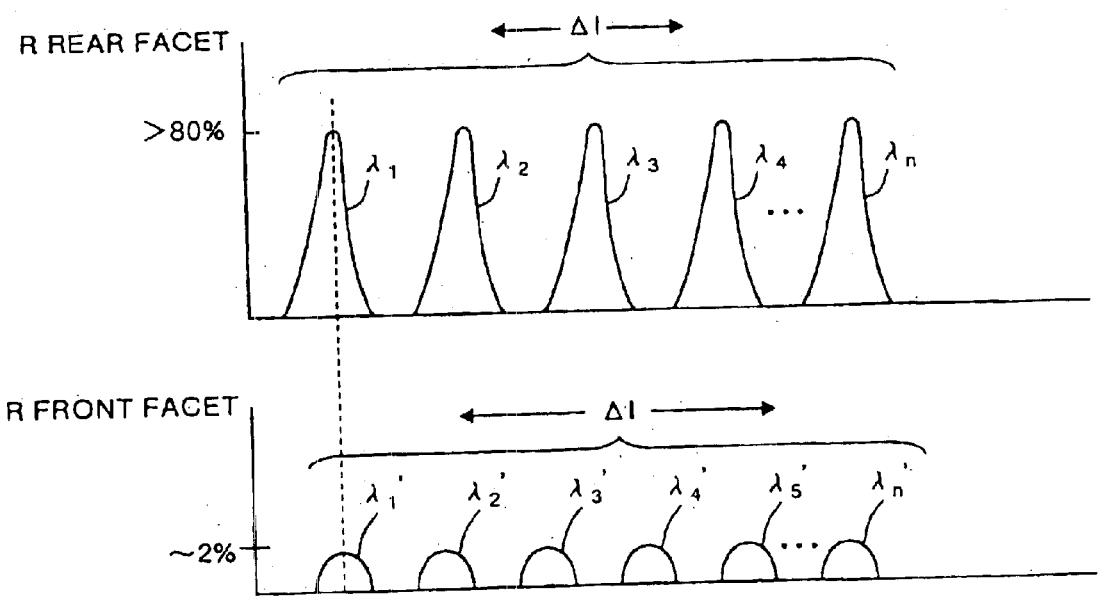
FIG. 15B is an illustration of the vernier tuning principle of a multiple mode laser in accordance with the present invention.

By providing a grating at the front and rear end of the laser device, the laser can achieve a wide tuning range by a vernier effect on discrete reflective modes of each grating. A similar tuning principle has been described for single mode lasers in Broad-Range Wavelength-Tunable Superstructure Grating (SSG) DBR Lasers Tohmori et al. IEEE Journal of Quantum Electronics, vol.29, No. 6, June 1993, the entire contents of which is incorporated herein by reference. However, Applicants have discovered that the wide tuning principle may be applied to multiple mode lasers suitable for pumping a Raman amplifier. FIG. 15B illustrates this principle.

As seen in FIG. 15B the grating 13b at the light-reflecting end of the laser is constructed to have a wide reflectivity bandwidth with discrete reflectivity modes $\lambda 1 \ldots n$ having a specific reflectivity mode spacing. Similarly, the grating 13a at the light emitting end of the laser is constructed to have a wide reflectivity bandwidth with discrete reflectivity modes modes $\lambda 1' \ldots \lambda n'$ having a slightly different reflectivity mode spacing than that provided by the grating 13a. It is noted that each of the reflective modes from the gratings 13a and 13b provides a reflectivity wavelength range sufficient to provide multiple longitudinal mode oscillations within the laser cavity. Moreover, the reflectivity of the front grating 13a is preferably less than 2%, while the rear grating 13b is preferably greater than 80%. Because the reflectivity bands of the front and rear gratings have different mode spacings, a vernier effect occurs when the reflectivity bandwidths of the front and rear gratings are shifted relative to one another. Specifically, shifting one bandwidth moves all reflectivity modes of the shifted bandwidth relative to the modes of the other bandwidth. Where modes of the front grating bandwidth and the rear grating match up with one another, the laser will oscillate at the matched wavelengths and output a multiple longitudinal mode spectrum corresponding to the matched reflectivity mode wavelengths. While only a single mode match can occur at any point along the shifting range of the reflectivity bandwidths, a large number of reflectivity mode matches can occur (at widely varying wavelengths) over the shifting range. Thus, a relatively small shift range of the individual grating bandwidths can result in a wide wavelength range of laser outputs. In this regard, it is also noted that the wide range of tuning can be achieved by injecting current into either one or both of the front and rear gratings.

Figure 16A:
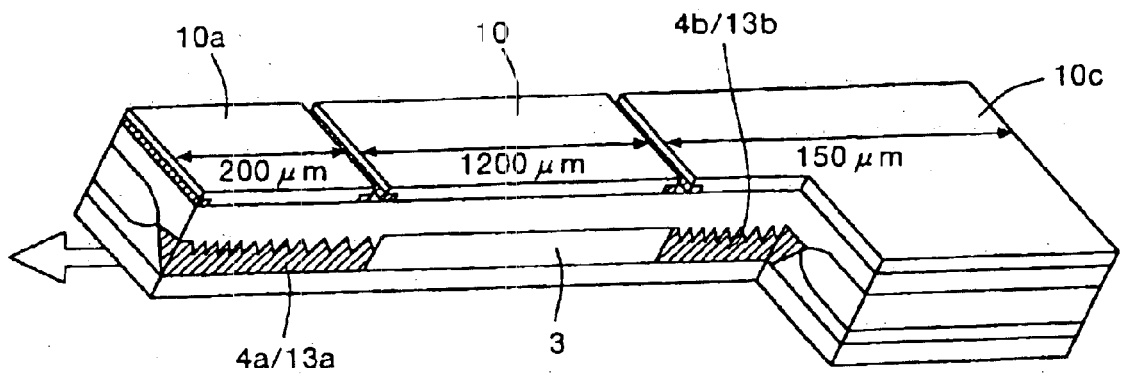
FIGS. 16A–16D show the structure and characteristics of a tunable DBR multimode laser according to another embodiment of the present invention.
Figure 16B:
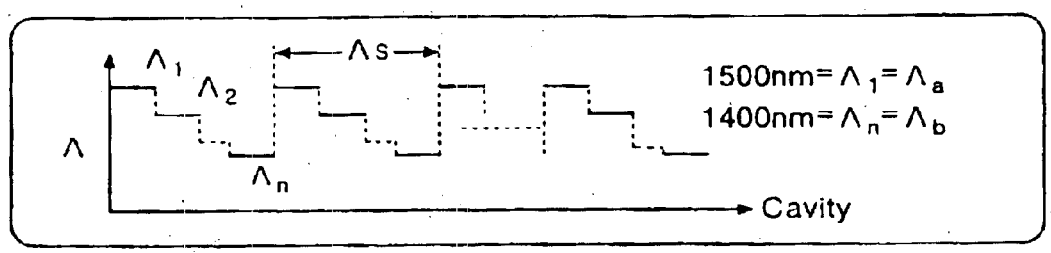

FIGS. 16A–16D show another embodiment of the tunable DBR multimode laser. FIG. 16A is a partial cross section perspective view of a tunable DBR laser in accordance with the present invention. As seen in FIG. 16A, the tunable multimode laser device includes an active region 3 having a cavity length of 1200 µm, a front grating area 4a/13a having a length of 200 µm, and rear grating area 4b/13b having a length of 750 µm. FIG. 16B is a graph illustrating the spacing of the gratings. As seen in this figure, the gratings are linearly chirped from a spacing $\Lambda 1$ corresponding to 1400 nm to a spacing $\Lambda 2$ corresponding to 1500 nm. Moreover, a period As of linear chirping is made to determine the reflectivity mode spacing within each grating. In the embodiment of FIG. 16A, the reflectivity mode spacing of the front grating 4a/13a is 9.7 nm, while the reflectivity mode spacing of the rear grating 4b/13b is 8.7 nm. Thus, the grating structures provide the necessary difference in mode spacing required for verneir tuning of the laser device as previously described.

Figure 16C:
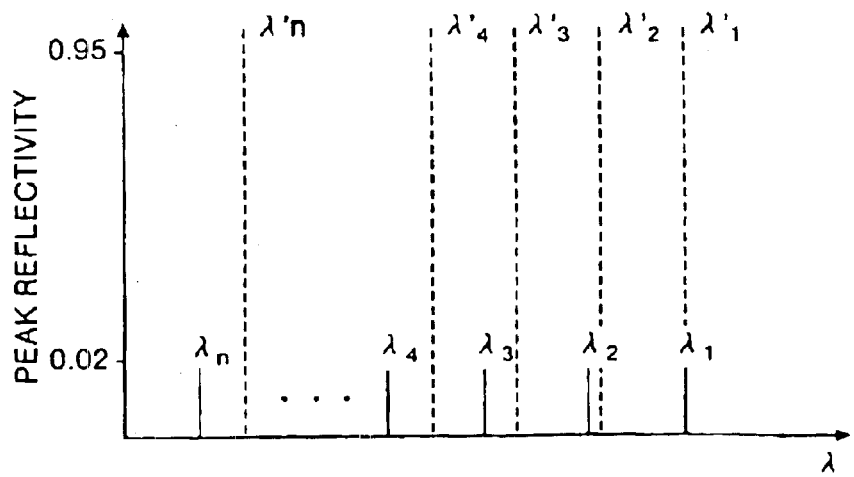
Figure 16D:
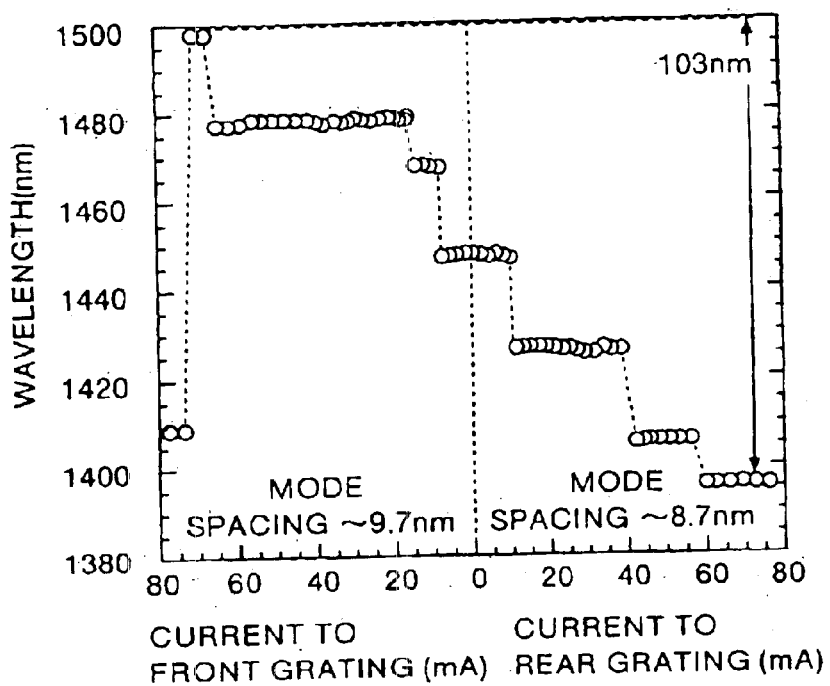

FIG. 16C is a graph showing the wavelength spacing of the reflectivity modes of the front and rear grating of the tunable laser device of FIG. 16A. In FIG. 16C, the reflectivity modes of the front grating $\lambda 1 \ldots \lambda n$ provide a reflectivity of less than 2% and are represented by solid lines, while the reflectivity modes of the rear grating $\lambda 1' \ldots \lambda n'$ provide a reflectivity of more than 95% and are represented by dashed lines. As previously described, each of the reflectivity modes allows lasing at multiple longitudinal modes provided by the 1200 µm cavity length. As seen in FIG. 16C, the modes of the front grating $\lambda 1 \ldots \lambda n$ have a slightly different spacing than the modes of the rear grating $\lambda 1' \ldots \lambda n'$. Thus, only one matching can occur for any position of the reflectivity modes, as illustrated by $\lambda 1$ and $\lambda 1'$ being matched in FIG. 16C. While modes $\lambda 2/\lambda 2'$, $\lambda 3/\lambda 3'$, and $\lambda 4/\lambda 4'$ are shown unmatched in FIG. 16C, tuning of either the front or rear reflectivity modes can accomplish a matching of any of these mode pairs and a change in wavelength output of the device, thereby allowing tuning of the device. FIG. 16D illustrates the multiple mode tuning range of the laser constructed in accordance with FIG. 16A. As seen in this figure, tuning of the multiple longitudinal mode laser can be achieved over a range of 103 nm.

Figure 17:
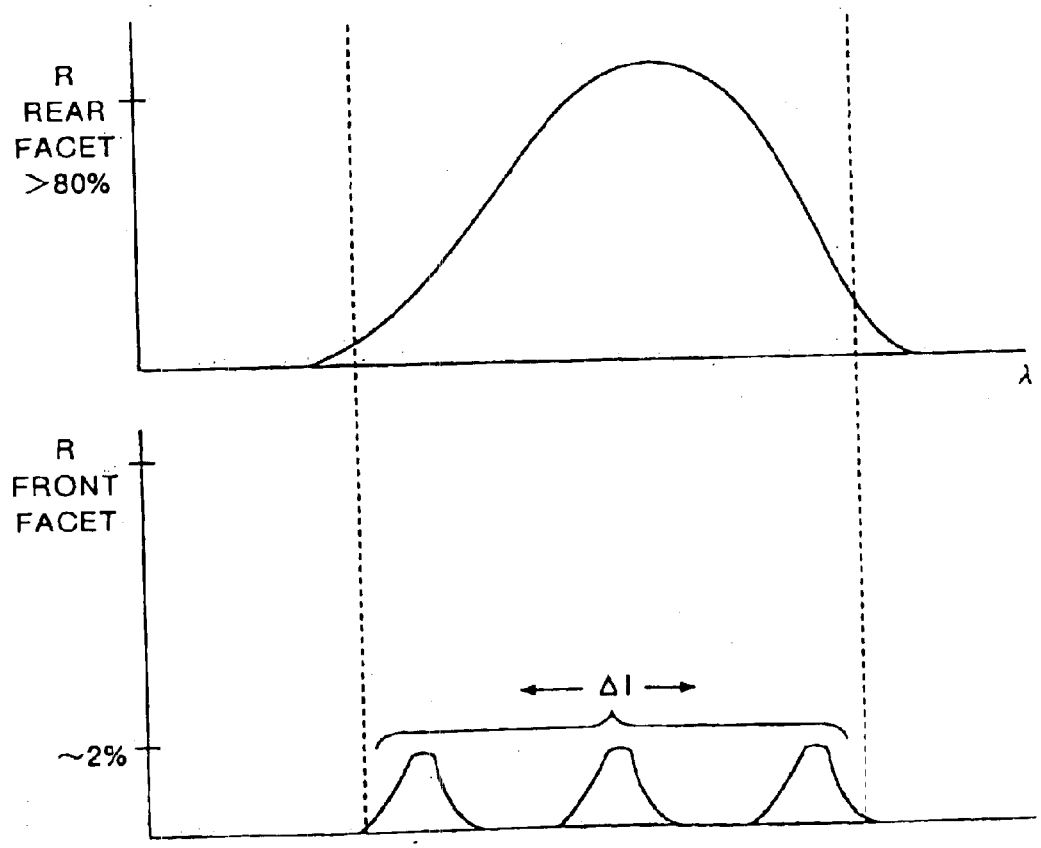
FIG. 17 is a graph illustrating a tunable laser according to another embodiment of the present invention.

In another embodiment of the tunable laser, the rear facet is provided with a fixed broad band reflectivity grating that is not tunable, and the front facet of the laser device is provided with a grating constructed to have a wide reflectivity bandwidth with discrete reflectivity modes $\lambda 1 \ldots \lambda n$ having a specific reflectivity mode spacing as previously described. FIG. 17 shows the reflectivity curves of this embodiment. As seen in FIG. 17, the multiple reflectivity modes substantially occupy the entire reflectivity bandwidth of the rear facet. As with the previous embodiments, each of the reflective modes from the front facet grating provides a reflectivity wavelength range sufficient to provide multiple longitudinal mode oscillations within the laser cavity. By shifting the front facet bandwidth, a single desired reflectivity mode can be made to occupy substantially any wavelength region within the rear facet reflectivity band. That is, a multiple longitudinal mode output spectrum can be achieved anywhere within the rear facet reflectivity curve. Undesired multiple longitudinal mode output spectrums that result from other reflectivity may then be attenuated by use of a selective attenuation mechanism or device such as a wavelength attenuator outside the laser.

In each of the embodiments previously described, the diffraction grating may have a constant physical spacing or a chirped physical spacing depending on the reflectivity characteristics desired for a particular laser application. Specifically, in yet another embodiment of the present invention, the wavelength oscillation profile 30 is manipulated by varying the physical pitch of the diffraction grating. Referring again to FIG. 3, the present inventors have realized that the wavelength oscillation profile 30 is shifted toward a longer wavelength where the width of the grating elements (i.e. the grating period) is increased. Similarly, the wavelength oscillation profile 30 is shifted toward a shorter wavelength where the grating period is decreased. Based on this realization, the present inventors have discovered that a chirped diffraction grating, wherein the grating period of the diffraction grating 13 is periodically changed, provides at least two oscillation profiles by the same laser device. These two oscillation profiles combine to provide a composite profile having a relatively wide predetermined spectral width w thereby effectively increasing the number of longitudinal modes within the predetermined spectral width w.

Figure 18:
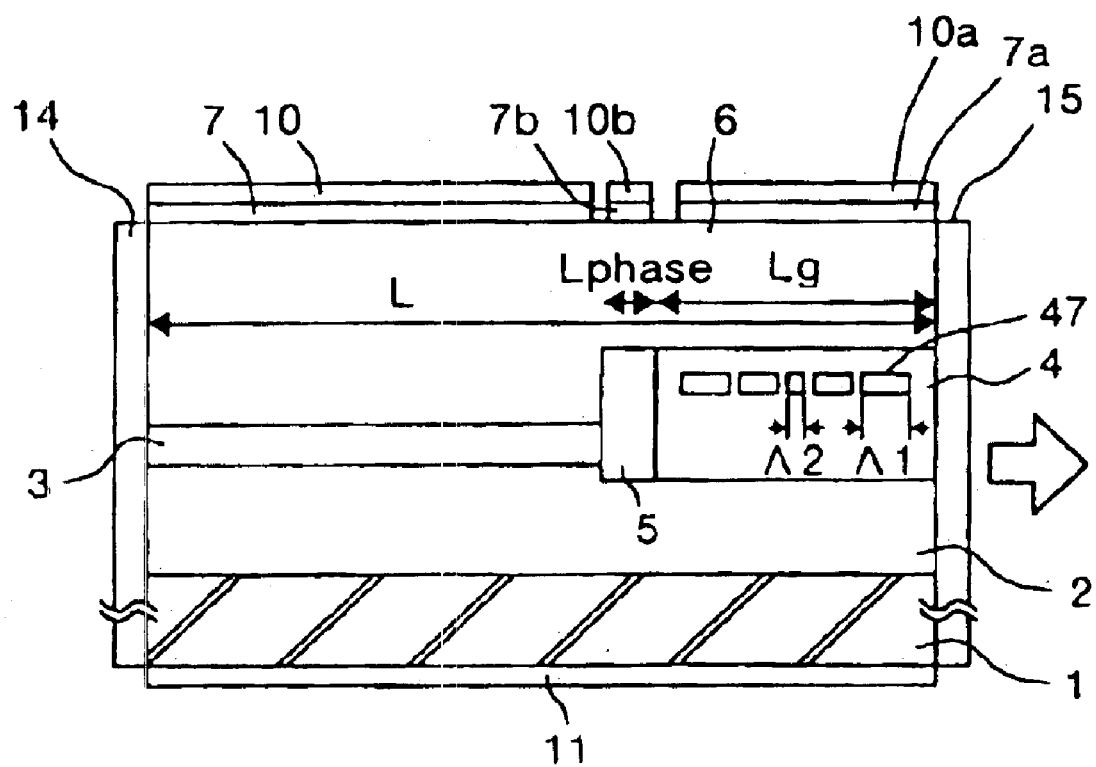
FIG. 18 is a vertical sectional view in the longitudinal direction illustrating a general configuration of a DBR semiconductor laser device having a chirped diffraction grating.

FIG. 18 is a vertical sectional view in the longitudinal direction illustrating a general configuration of a DBR semiconductor laser device having a chirped diffraction grating. As seen in this figure, diffraction grating 47 is positioned on the light emission side of the laser device and is made to include at least two grating periods $\Lambda 1$ and $\Lambda 2$.

FIG. 19 is a graph illustrating the principle of a composite oscillation wavelength spectrum produced by the combined period $\Lambda 1$ and $\Lambda 2$ of FIG. 18. As seen in FIG. 19, an oscillation wavelength spectrum corresponding to $\Lambda 1$ is produced at a longer wavelength than the oscillation wavelength spectrum corresponding to $\Lambda 2$ since the pitch $\Lambda 1$ is larger than $\Lambda 2$. Where these individual oscillation wavelength spectrums are made to overlap such that a short wavelength half power point of the spectrum of $\Lambda 1$ is at a shorter wavelength than a long wavelength half power point of the spectrum of $\Lambda 2$, a composite oscillation wavelength spectrum 40 is formed as shown in FIG. 19. This composite spectrum 40 defines a composite spectrum width wc to thereby effectively widen the predetermined spectral width of wavelength oscillation spectrum to include a larger number of oscillation longitudinal modes. Thus, the physical chirping of the grating 47 achieves the same effect as the effective chirping discussed with respect to FIGS. 5 and 6.

Figure 21A:
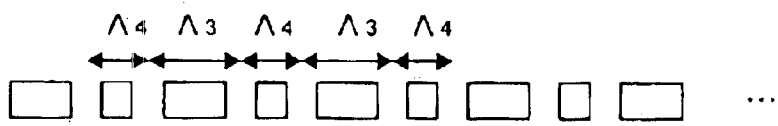
FIGS. 21A through 21C illustrate examples for realizing the periodic fluctuation of the diffraction grating in accordance with the present invention.
Figure 21B:
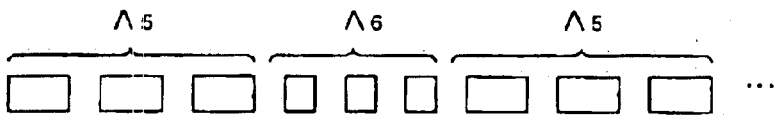
Figure 21C:
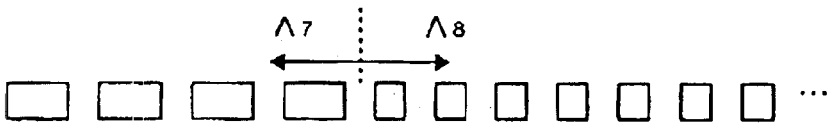

FIG. 20 illustrates a periodic fluctuation of the grating period of the diffraction grating 47. As shown in FIG. 20, the diffraction grating 47 has a structure in which the average period is 220 nm and the periodic fluctuation (deviation) of ±0.02 nm is repeated in the period C. Although the chirped grating is the one in which the grating period is changed in the fixed period C in the above-mentioned embodiment, configuration of the present invention is not limited to this, and the grating period may be randomly changed between a period $\Lambda 1$ (220 nm+0.02 nm) and a period $\Lambda 2$ (220 nm−0.02 nm). Moreover, as shown in FIG. 21A, the diffraction grating may be made to repeat the period $\Lambda 3$ and the period $\Lambda 4$ alternately. In addition, as shown in FIG. 21B, the diffraction grating may be made to alternatively repeat the period $\Lambda 5$ and the period $\Lambda 6$ for a plurality of times respectively and may be given fluctuation. And as shown in FIG. 21C, the diffraction grating may be made to have a plurality of successive periods $\Lambda 7$ followed by plurality of successive periods $\Lambda 8$.

While the chirped grating of FIGS. 19–21 are specifically illustrated within a DBR laser in FIG. 18, one of ordinary skill in the art would understand that these structures may be incorporated into the DFB configuration described with respect to FIGS. 1–8. Moreover, as would be understood by one of ordinary skill in the art, any combination of grating spacing and periodicity illustrated in FIGS. 18–21 can be implemented to achieve the reflectivity characteristics for a desired tunable multimode laser.

Figure 22:
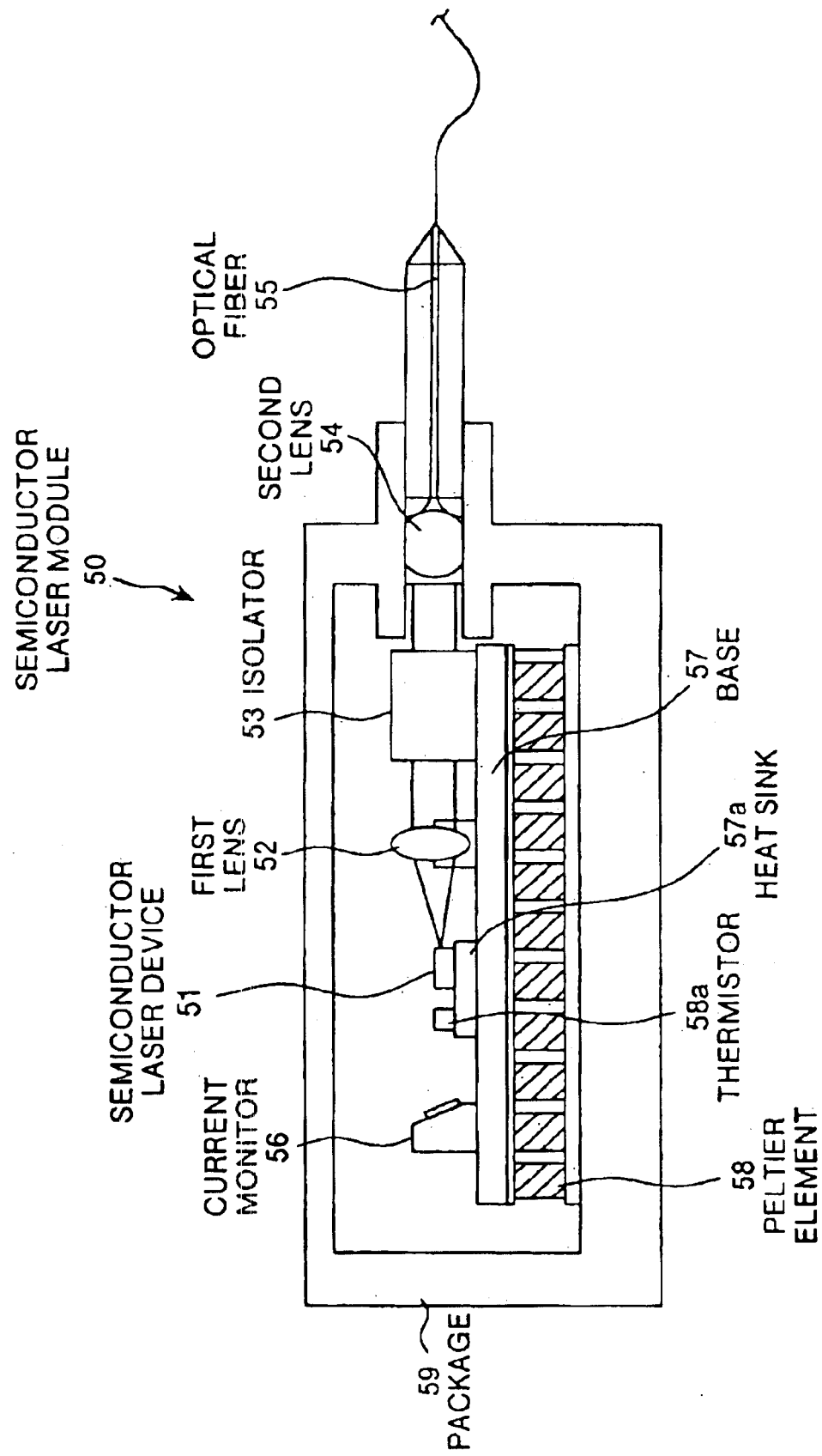
FIG. 22 is a vertical sectional view illustrating a configuration of a semiconductor laser module in accordance with the present invention.

FIG. 22 is a vertical sectional view illustrating the configuration of a semiconductor laser module having a semiconductor laser device according to the present invention. The semiconductor laser module 50 includes a semiconductor laser device 51, a first lens 52, an internal isolator 53, a second lens 54 and an optical fiber 55. Semiconductor laser device 51 is an integrated grating device configured in accordance with any of the above-described semiconductor laser devices and a laser beam irradiated from the semiconductor laser device 51 is guided to optical fiber 55 via first lens 52, internal isolator 53, and second lens 54. The second lens 54 is provided on the optical axis of the laser beam and is optically coupled with the optical fiber 55.

The semiconductor laser device 51 is preferably provided in a junction down configuration in which the p-side electrode is joined to the heat sink 57a, which is mounted on the base 57. A back facet monitor photo diode 56 is also disposed on a base 57 which functions as a heat sink and is attached to a temperature control device 58 mounted on the metal package 59 of the laser module 50. The back facet monitor photo diode 56 acts as a current monitor to detect a light leakage from the reflection coating side of the semiconductor laser device 51. This monitor current is used to control the light output of the laser module to thereby control the gain of the Raman amplifier.

The temperature control device 58 is a Peltier module. Although current (not shown) is given to the Peltier module 58 to perform cooling and heating by its polarity, the Peltier module 58 functions mainly as a cooler in order to prevent an oscillation wavelength shift by the increase of temperature of the semiconductor laser device 51. That is, if a laser beam has a longer wavelength compared with a desired wavelength, the Peltier element 58 cools the semiconductor laser device 51 and controls it at a low temperature, and if a laser beam has a shorter wavelength compared with a desired wavelength, the Peltier element 58 heats the semiconductor laser device 51 and controls it at a high temperature. By performing such a temperature control, the wavelength stability of the semiconductor laser device can be improved. Alternatively, a thermistor 58a can be used to control the characteristics of the laser device. If the temperature of the laser device measured by a thermistor 58a located in the vicinity of the laser device 51 is higher, the Peltier module 58 cools the semiconductor laser device 51, and if the temperature is lower, the Peltier module 58 heats the semiconductor laser device 51. By performing such a temperature control, the wavelength and the output power characteristics of the semiconductor laser device are stabilized.

Figure 23:
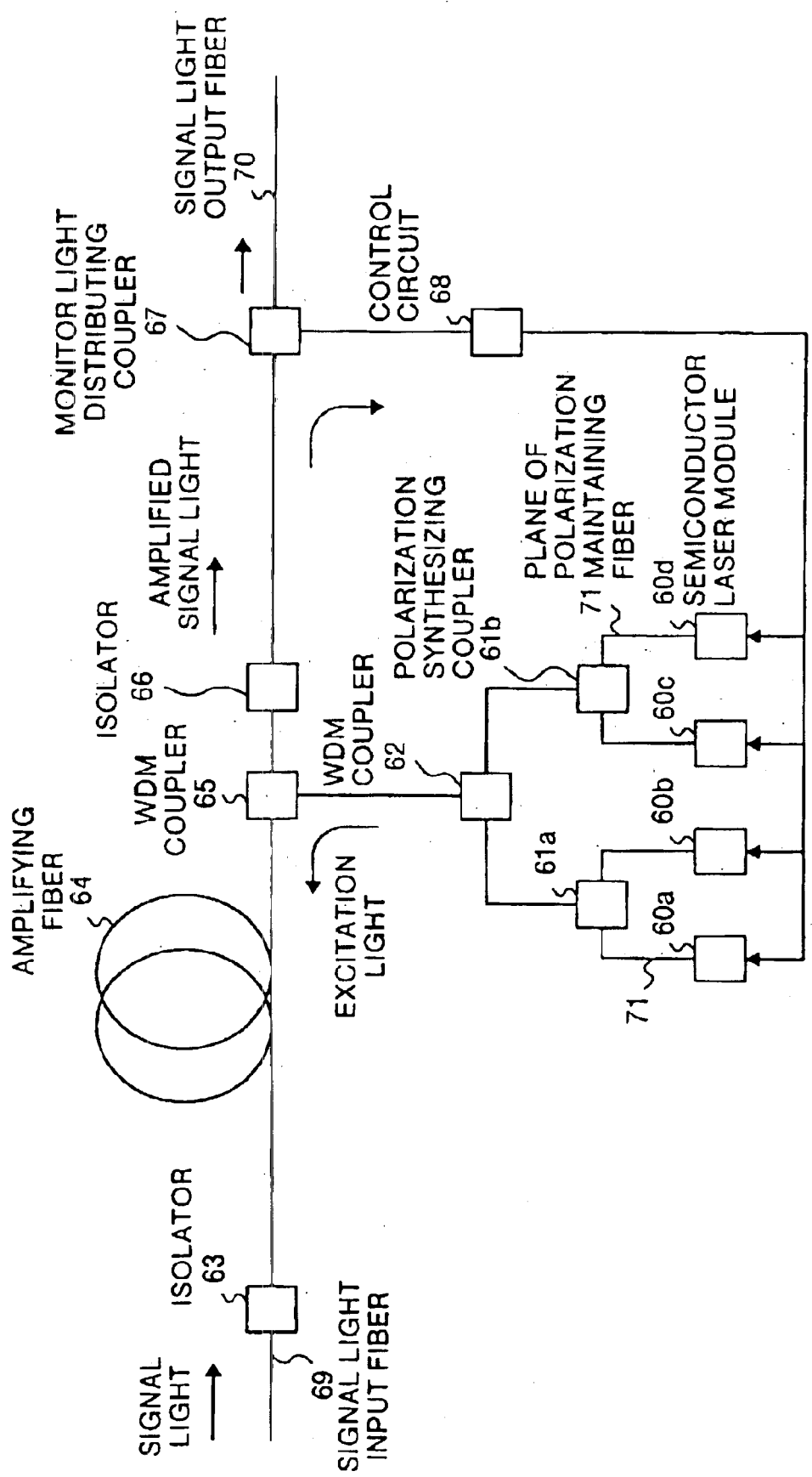
FIG. 23 is a block diagram illustrating a configuration of a Raman amplifier in which polarization dependency is canceled by polarization-multiplexing of pumping light beams output from two semiconductor laser devices, in accordance with an embodiment of the present invention.

FIG. 23 is a block diagram illustrating a configuration of a Raman amplifier used in a WDM communication system in accordance with the present invention. In FIG. 23, semiconductor laser modules 60a through 60d are of the type described in the embodiment of FIG. 11. The laser modules 60a and 60b output laser beams having the same wavelength via polarization maintaining fiber 71 to polarization-multiplexing coupler. Similarly, laser beams outputted by each of the semiconductor laser modules 60c and 60d have the same wavelength, and they are polarization-multiplexed by the polarization-multiplexing coupler 61b. Each of the laser modules 60a through 60d outputs a laser beam having a plurality of oscillation longitudinal modes in accordance with the present invention to a respective polarization-multiplexing coupler 61a and 61b via a polarization maintaining fiber 71.

Polarization-multiplexing couplers 61a and 61b output polarization-multiplexed laser beams having different wavelengths to a WDM coupler 62. The WDM coupler 62 multiplexes the laser beams outputted from the polarization multiplexing couplers 61a and 61b, and outputs the multiplexed light beams as a pumping light beam to amplifying fiber 64 via WDM coupler 65. Signal light beams to be amplified are input to amplifying fiber 64 from signal light inputting fiber 69 via isolator 63. The amplified signal light beams are Raman-amplified by being multiplexed with the pumping light beams and input to a monitor light branching coupler 67 via the WDM coupler 65 and the polarization-independent isolator 66. The monitor light branching coupler 67 outputs a portion of the amplified signal light beams to a control circuit 68, and the remaining amplified signal light beams as an output laser beam to signal light outputting fiber 70.

The control circuit 68 controls a light-emitting state, for example, an optical intensity, of each of the semiconductor laser module 60a through 60d based on the portion of the amplified signal light beams input to the control circuit 68. This optical intensity of the Raman amplifier output is used along with the monitor current photodiode 56 of the laser module in FIG. 15 to control the output of the semiconductor lasers of each module. Thus, control circuit 68 performs feedback control of a gain band of the Raman amplification such that the gain band will be flat over wavelength.

Figure 24:
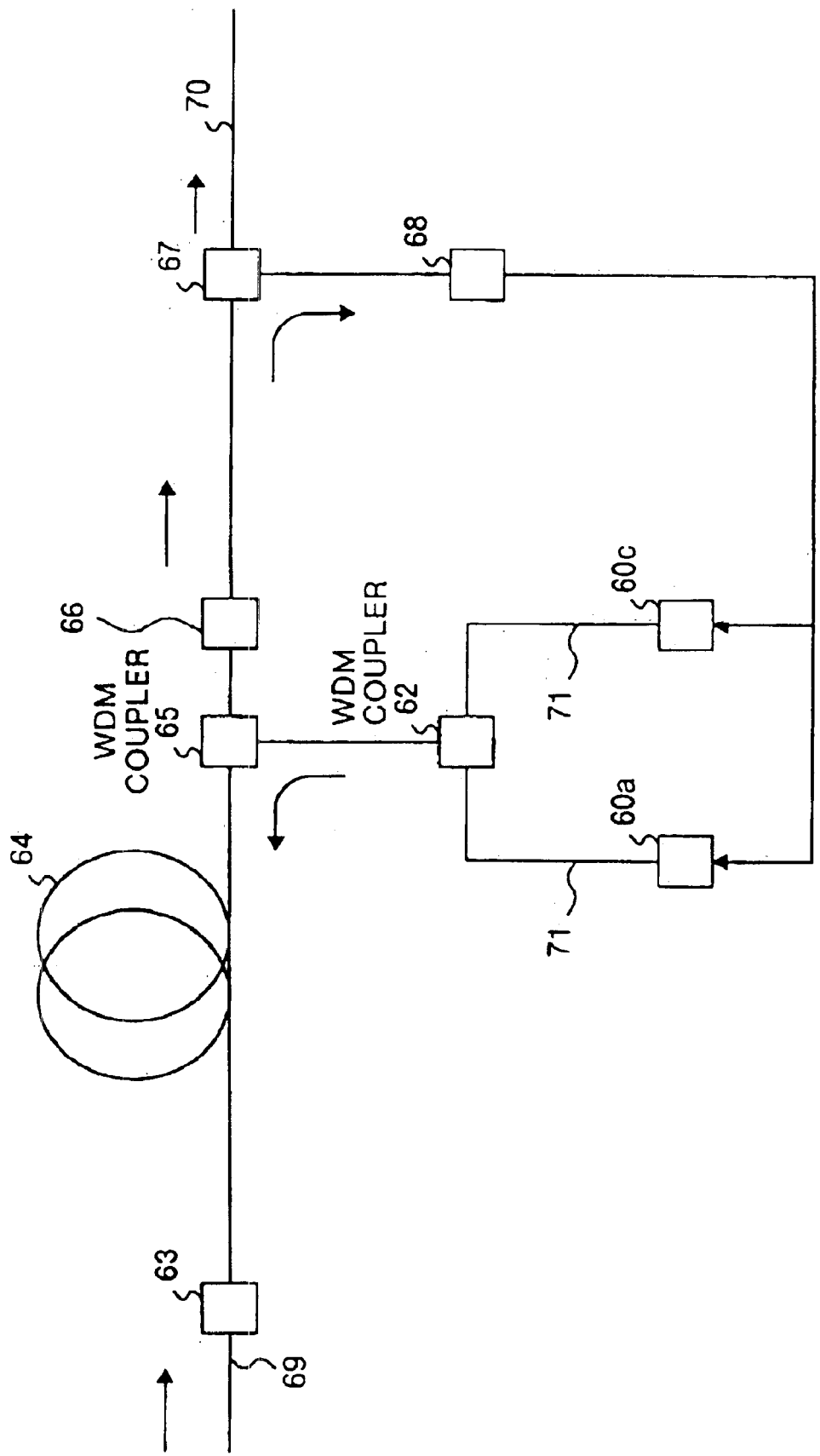
FIG. 24 is a block diagram illustrating a configuration of a Raman amplifier in which polarization dependency is canceled by depolarizing a pumping light beam output from a single semiconductor laser device using polarization maintaining fibers as a depolarizer, in accordance with an embodiment of the present invention.

Although the Raman amplifier illustrated in FIG. 23 is the backward pumping method, it is to be understood that the semiconductor laser device, module and Raman amplifier of the present invention may be used with a forward pumping method or the bi-directional pumping method. Moreover, the Raman amplifier can be constructed by wavelength-multiplexing of a plurality of pumping light sources which are not polarization-multiplexed. That is, the semiconductor laser module of the present invention can be used in a Raman amplifier where the polarization-multiplexing of pumping light is not performed. FIG. 24 is a block diagram illustrating a configuration of a Raman amplifier in which polarization dependency is canceled by depolarizing a pumping light beam output from a single semiconductor laser device using polarization maintaining fibers as a depolarizer, in accordance with an embodiment of the present invention. As seen in this figure, laser modules 60A and 60C are directly connected to WDM coupler 62 via a polarization maintaining fiber 71. In this configuration, the angle of the polarization axis of the polarization maintaining fiber against the emitted light from semiconductor laser device is approximately 45 degrees.

Figure 25:
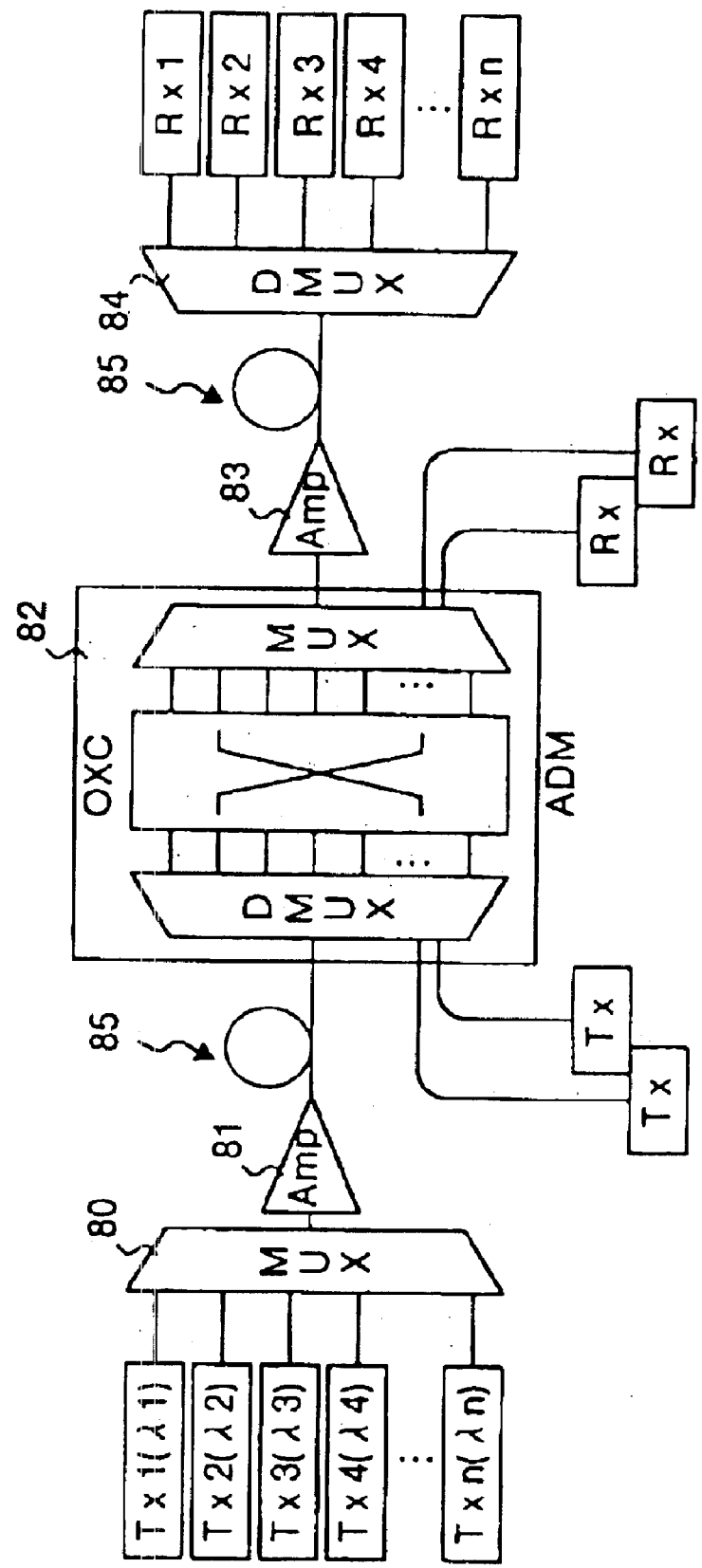
FIG. 25 is a block diagram illustrating a general configuration of a WDM communication system in which the Raman amplifier shown in FIGS. 16 and 17 are used.

The Raman amplifier illustrated in FIGS. 23 and 24 can be applied to the WDM communication system as described above. FIG. 25 is a block diagram illustrating a general configuration of the WDM communication system to which the Raman amplifier shown in either FIG. 23 or FIG. 24 is applied.

In FIG. 25, optical signals of wavelengths λ1 through λn are forwarded from a plurality of transmitter Tx1 through Tx n to multiplexing coupler 80 where they are wavelength-multiplexed and output to optical fiber 85 line for transmission to a remote communications unit. On a transmission route of the optical fiber 85, a plurality of Raman amplifiers 81 and 83 corresponding to the Raman amplifier illustrated in FIG. 21 or FIG. 22 are disposed amplifying an attenuated optical signal. A signal transmitted on the optical fiber 85 is divided by an optical demultiplexer 84 into optical signals of a plurality of wavelengths λ1 through λn, which are received by a plurality of receivers Rx1 through Rx n. Further, an ADM (Add/Drop Multiplexer) may be inserted on the optical fiber 85 for inserting and removing an optical signal of an arbitrary wavelength.

Obviously, numerous modifications and variations of the present invention are possible in light of the above teachings. It is therefore to be understood that within the scope of the appended claims, the invention may be practiced otherwise than as specifically described herein. For example, the present invention has been described as a pumping light source for the Raman amplification, it is evident that the configuration is not limited to this usage and may be used as an EDFA pumping light source of the oscillation wavelength of 980 nm and 1480 nm.

What is claimed is:

1. A semiconductor laser device comprising:
   a light reflecting facet positioned on a first side of a semiconductor laser device;
   a light emitting facet positioned on a second side of said semiconductor laser device thereby forming a resonator between said light reflecting facet and said light emitting facet;
   an active layer configured to radiate light in the presence of an injection current, said active layer positioned within said resonator;
   a wavelength selection structure positioned within said resonator and configured to select a spectrum of said light including multiple longitudinal modes, said spectrum being output from said light emitting facet; and
   an electrode positioned along said resonator and configured to provide said injection current, and a tuning current that provides a sufficient change in current to adjust a center wavelength of said spectrum selected by said wavelength selection structure.

2. The semiconductor laser device of claim 1, wherein said wavelength selection structure comprises a diffraction grating positioned along a portion of said active layer in a distributed feedback (DFB) configuration.

3. The semiconductor laser device of claim 2, wherein said electrode comprises:
   a first portion configured to provide said injection current and positioned along said active layer where no diffraction grating exists; and
   a second portion positioned along the diffraction grating and configured to supply said tuning current to said diffraction grating.

4. The semiconductor laser device of claim 3, wherein said first portion of the electrode is electrically insulated from the second portion of the electrode and said injection current and tuning current are independently adjustable.

5. The semiconductor laser device of claim 4, wherein said second portion of the electrode comprises a comb pattern of insulating material configured to vary the current density of said tuning current.

6. The semiconductor laser device of claim 3, wherein
said first portion of the electrode is electrically connected to the second portion of the electrode and said injection current and tuning current are provided by the same current source, and
said second portion of the electrode comprises a comb pattern of insulating material configured to vary the current density of said tuning current.

7. The semiconductor laser device of claim 2, wherein said active layer comprises a quantum dot structure.

8. The semiconductor laser device of claim 2, wherein said diffraction grating is positioned adjacent to either said light emitting facet or said light reflecting facet.

9. The semiconductor laser device of claim 2, wherein said diffraction grating comprises:
a first diffraction grating positioned along said active layer adjacent to said light emitting facet; and
a second diffraction grating positioned along said active layer adjacent to said light reflecting facet.

10. The semiconductor laser device of claim 2, wherein said diffraction grating is a chirped grating.

11. The semiconductor laser device of claim 1, wherein said wavelength selection structure comprises:
a wavepath layer positioned along a portion of the resonator length where no active layer exists in a distributed Bragg reflector (DBR) configuration; and
a diffraction grating positioned within the wavepath layer.

12. The semiconductor laser device of claim 11, wherein said electrode comprises:
a first portion configured to provide said injection current and positioned along said active layer; and
a second portion positioned along said wavepath layer and configured to supply a tuning current to the wavepath layer.

13. The semiconductor laser device of claim 12, wherein said first portion of the electrode is electrically insulated from the second portion of the electrode and said injection current and tuning current are independently adjustable.

14. The semiconductor laser device of claim 12, wherein said second portion of the electrode comprises a comb pattern of insulating material configured to vary the current density of said tuning current.

15. The semiconductor laser device of claim 12, wherein
said first portion of the electrode is electrically connected to the second portion of the electrode and said injection current and tuning current are provided by the same source, and
said second portion of the electrode comprises a comb pattern of insulating material configured to vary the current density of said tuning current.

16. The semiconductor laser device of claim 11, further comprising a phase adjustment layer positioned within said resonator along a portion of said resonator length interposed between said active layer and said wavepath layer, wherein said electrode further comprises a third portion positioned along said phase adjustment layer and electrically insulated from said first and second portions of the electrode.

17. The semiconductor laser device of claim 11, wherein said active layer comprises a quantum dot structure.

18. The semiconductor laser device of claim 11, wherein said wavepath layer is positioned adjacent to either said light emitting facet or said light reflecting facet.

19. The semiconductor laser device of claim 11, wherein said wavepath layer comprises:
a first wavepath layer having a first diffraction grating and positioned adjacent to said light emitting facet, and
a second wavepath layer having a second diffraction grating and positioned adjacent to said light reflecting facet, and said electrode comprises:
a first portion positioned along said first wavepath layer,
a second portion positioned along said second wavepath layer, and
a third portion positioned along said active layer where no wavepath layer exists.

20. The semiconductor laser device of claim 19, wherein at least one of said first wavepath layer and said second wavepath layer is coupled to said active layer by a phase adjusting layer having a separate electrode.

21. The semiconductor laser device of claim 20, wherein said first, second, and third portion of the electrode are electrically insulated from each other.

22. The semiconductor laser device of claim 21, wherein said first wavepath layer has a length of 200 $\mu$m, said second wavepath layer has a length of 750 $\mu$m, and said active layer has a length of 1200 $\mu$m.

23. The semiconductor laser device of claim 22, wherein at least one of said first and second diffraction grating is a linearly chirped grating.

24. A method of providing a light output from a semiconductor laser device having an active layer and a diffraction grating positioned within a resonator defined by a light reflecting and light emitting facet, said method comprising:
injecting a first current into said active layer at a portion of the resonator where said diffraction grating does not exist; and
injecting a second current into diffraction grating, wherein said first current controls a light output of the laser device and said second current controls a tuning wavelength of the laser device.

25. The method of claim 24, wherein said first and second currents are provided by independently controllable current sources.

26. The method of claim 24, wherein said first and second currents are provided by a common current source, said method further comprising providing a current changing structure in a portion of said resonator including the diffraction grating, said current changing structure changing the current provided by the common current source to provide said first and second currents having a different current density.

27. A semiconductor laser device comprising:
means for radiating light within a semiconductor laser device;
means for oscillating said light within the semiconductor laser device for output by the laser device; and
means for tuning the wavelength of the light output of the laser device, wherein said means for turning comprises:
means for selecting a spectrum of said light including multiple longitudinal modes; and
means for tuning said means for selecting.

28. A semiconductor laser module comprising:
a semiconductor laser device comprising:
a light reflecting facet positioned on a first side of said semiconductor device,
a light emitting facet positioned on a second side of said semiconductor device thereby forming a resonator between said light reflecting facet and said light emitting facet, an active layer configured to radiate light in the presence of an injection current, said active layer positioned within said resonator, a wavelength selection structure positioned within said resonator and configured to select a spectrum of said light including multiple longitudinal modes, said spectrum being output from said light emitting facet, and an electrode positioned along said resonator and configured to provide said injection current, and a tuning current that adjusts a center wavelength of said spectrum selected by said wavelength selection structure; and a wave guide device for guiding said laser beam away from the semiconductor laser device.

29. An optical fiber amplifier comprising:

a semiconductor laser device comprising:
- a light reflecting facet positioned on a first side of said semiconductor device,
- a light emitting facet positioned on a second side of said semiconductor device thereby forming a resonator between said light reflecting facet and said light emitting facet,
- an active layer configured to radiate light in the presence of an injection current, said active layer positioned within said resonator,
- a wavelength selection structure positioned within said resonator and configured to select a spectrum of said light including multiple longitudinal modes, said spectrum being output from said light emitting facet; and
- an electrode positioned along said resonator and configured to provide said injection current, and a tuning current that adjusts a center wavelength of said spectrum selected by said wavelength selection structure; and an amplifying fiber coupled to said semiconductor laser device and configured to amplify a signal by using said light beam as an excitation light.

30. A wavelength division multiplexing system comprising:

a transmission device configured to provide a plurality of optical signals having different wavelengths;

an optical fiber amplifier coupled to said transmission device and including a semiconductor laser device comprising:
- a light reflecting facet positioned on a first side of said semiconductor device,
- a light emitting facet positioned on a second side of said semiconductor device thereby forming a resonator between said light reflecting facet and said light emitting facet,
- an active layer configured to radiate light in the presence of an injection current, said active layer positioned within said resonator,
- a wavelength selection structure positioned within said resonator and configured to select a spectrum of said light including multiple longitudinal modes, said spectrum being output from said light emitting facet; and a receiving device coupled to said optical fiber amplifier and configured to receive said plurality of optical signals having different wavelengths.

31. A Raman amplifier comprising:

a semiconductor laser device comprising:
- a light reflecting facet positioned on a first side of said semiconductor device,
- a light emitting facet positioned on a second side of said semiconductor device thereby forming a resonator between said light reflecting facet and said light emitting facet,
- an active layer configured to radiate light in the presence of an injection current, said active layer positioned within said resonator,
- a wavelength selection structure positioned within said resonator and configured to select a spectrum of said light including multiple longitudinal modes, said spectrum being output from said light emitting facet; and a fiber coupled to said semiconductor laser device and configured to carry a signal that is amplified based on said light beam being applied to said fiber.

32. The Raman amplifier of claim 31, wherein said semiconductor laser device is coupled to said fiber at an input side of said fiber such that said light beam is applied in a forward pumping method.

33. The Raman amplifier of claim 31, wherein said semiconductor laser device is coupled to said fiber at an output side of said fiber such that said light beam is applied in a backward pumping method.

34. The Raman amplifier of claim 31, wherein said semiconductor laser device is coupled to said fiber at both an input and output side of said fiber such that said light beam is applied in both a forward and backward pumping method.

* * * * *